(12) United States Patent
Jang et al.

(10) Patent No.: US 10,553,438 B2
(45) Date of Patent: Feb. 4, 2020

(54) SEMICONDUCTOR DEVICE AND METHOD FOR FABRICATING THE SAME

(71) Applicant: SAMSUNG ELECTRONICS CO., LTD., Suwon-si, Gyeonggi-do (KR)

(72) Inventors: Yun Kyeong Jang, Seoul (KR); Sang Jin Kim, Suwon-si (KR); Dong Woon Park, Seoul (KR); Joon Soo Park, Seongnam-si (KR); Chang Jae Yang, Seoul (KR); Kwang Sub Yoon, Yongin-si (KR); Hye Kyoung Jue, Ulsan (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/409,813

(22) Filed: Jan. 19, 2017

(65) Prior Publication Data
US 2017/0372906 A1    Dec. 28, 2017

(30) Foreign Application Priority Data

Jun. 27, 2016    (KR) .......................... 10-2016-0080110

(51) Int. Cl.
*H01L 21/28* (2006.01)
*H01L 21/033* (2006.01)
*H01L 21/8234* (2006.01)

(52) U.S. Cl.
CPC .... *H01L 21/28123* (2013.01); *H01L 21/0337* (2013.01); *H01L 21/823431* (2013.01); *H01L 21/823456* (2013.01)

(58) Field of Classification Search
CPC ....... H01L 21/28123; H01L 21/823456; H01L 21/823431; H01L 21/82385; H01L 21/3086
See application file for complete search history.

(56) References Cited

U.S. PATENT DOCUMENTS 7,045,413 B2    5/2006  Lee et al.
7,488,685 B2 *  2/2009  Kewley ............... H01L 21/0337
                                                216/72
(Continued)

FOREIGN PATENT DOCUMENTS

KR    10-2007-0003338 A    1/2007
KR    10-2010-0076693 A    7/2010

*Primary Examiner* — Latanya N Crawford
(74) *Attorney, Agent, or Firm* — Lee & Morse, P.C.

(57) ABSTRACT

A method for fabricating a semiconductor device includes stacking a semiconductor layer, a first sacrificial layer, and a second sacrificial layer, patterning the second sacrificial layer to form a second sacrificial pattern, forming a spacer pattern on both sides of the second sacrificial pattern, wherein a pitch of the spacer pattern is constant, and a width of the spacer pattern is constant, removing the second sacrificial pattern, forming a mask layer that covers the spacer pattern, forming a supporting pattern on the mask layer, wherein a width of the supporting pattern is greater than a width of the spacer pattern, and the supporting pattern is overlapped with the spacer pattern, transferring the supporting pattern and the spacer pattern onto the first sacrificial layer to form gate and supporting patterns, and transferring the gate and supporting patterns onto the semiconductor layer to form a gate and a supporting gate.

19 Claims, 35 Drawing Sheets

(56) References Cited

U.S. PATENT DOCUMENTS

| | | |
|---|---|---|
| 8,093,645 B2 | 1/2012 | Yamashita |
| 8,629,052 B2 | 1/2014 | Park |
| 8,865,583 B2 | 10/2014 | Yanagidaira et al. |
| 8,877,647 B2 * | 11/2014 | Tsai ................ H01L 21/306 |
| | | 216/47 |
| 9,029,263 B1 * | 5/2015 | Kim ............ H01L 21/823437 |
| | | 257/E21.038 |
| 9,117,762 B2 | 8/2015 | Shin |
| 9,136,178 B2 * | 9/2015 | Li ................ H01L 21/28123 |
| 9,293,343 B2 * | 3/2016 | Lee ............... H01L 21/76816 |
| 2012/0156866 A1 | 6/2012 | Ahn |
| 2012/0156883 A1 | 6/2012 | Choi |
| 2012/0282779 A1 * | 11/2012 | Arnold ............ H01L 21/0337 |
| | | 438/703 |
| 2014/0024219 A1 * | 1/2014 | Jung ............... H01L 21/0337 |
| | | 438/703 |
| 2014/0248773 A1 * | 9/2014 | Tsai ................ H01L 21/306 |
| | | 438/689 |
| 2015/0076702 A1 | 3/2015 | Iida et al. |

\* cited by examiner

SEMICONDUCTOR DEVICE AND METHOD FOR FABRICATING THE SAME

CROSS-REFERENCE TO RELATED APPLICATION

Korean Patent Application No. 10-2016-0080110, filed on Jun. 27, 2016, in the Korean Intellectual Property Office, and entitled: "Semiconductor Device and Method for Fabricating the Same," is incorporated by reference herein in its entirety.

BACKGROUND

1. Field

The present disclosure relates to a semiconductor device and a method for fabricating the same.

2. Description of the Related Art

As one of the scaling technologies to increase the density of semiconductor devices, the multi-gate transistor has been suggested, in which silicon bodies in a fin or nano wire shape are formed on a substrate, with gates then being formed on surfaces of the silicon bodies. Such a multi-gate transistor allows easy scaling, as it uses a three-dimensional channel. Further, current control capability can be enhanced without requiring increased gate length of the multi-gate transistor. Furthermore, it is possible to effectively suppress short channel effect (SCE) which is the phenomenon that the electric potential of the channel region is influenced by the drain voltage.

SUMMARY

Embodiments provide a semiconductor device with improved operating characteristics, and a method for fabricating a semiconductor device with improved operating characteristics.

According to an aspect of embodiments, there is provided a method for fabricating a semiconductor device, including forming, on a substrate, a semiconductor layer, a first sacrificial layer, and a second sacrificial layer, sequentially, patterning the second sacrificial layer to form a second sacrificial pattern, forming a spacer pattern on both sides of the second sacrificial pattern respectively, wherein a pitch of the spacer pattern is constant, and a width of the spacer pattern is constant, removing the second sacrificial pattern, forming a mask layer that covers the spacer pattern, forming a supporting pattern on the mask layer, wherein a width of the supporting pattern is greater than a width of the spacer pattern, and the supporting pattern is overlapped with at least a portion of the spacer pattern, transferring the supporting pattern and the spacer pattern onto the first sacrificial layer to form a sacrificial gate pattern and a sacrificial supporting pattern and transferring the sacrificial gate pattern and the sacrificial supporting pattern onto the semiconductor layer to form a gate and a supporting gate.

According to another aspect of embodiments, there is provided a method for fabricating a semiconductor device, including forming, on a substrate, a semiconductor layer, a first sacrificial layer, a second sacrificial layer, and a first mask layer sequentially, patterning the first mask layer using exposure to form a first mask pattern, transferring the first mask pattern onto the second sacrificial layer to form a second sacrificial pattern, forming spacer patterns on both sides of the second sacrificial pattern, forming a second mask layer that covers the spacer pattern, forming a supporting pattern on the second mask layer, wherein the supporting pattern is overlapped with the spacer pattern, patterning the second mask layer using exposure to form a second mask pattern, transferring the second mask pattern and the spacer pattern onto the first sacrificial layer to form a sacrificial gate pattern and a sacrificial supporting pattern and transferring the sacrificial gate pattern and the sacrificial supporting pattern onto the semiconductor layer to form a gate and a supporting gate.

According to still another aspect of embodiments, there is provided a method for fabricating a semiconductor device, including forming, sequentially, a semiconductor layer and a first sacrificial layer on a substrate, forming a plurality of spacer patterns with a constant pitch and a constant width on the first sacrificial pattern, forming a mask layer that covers the plurality of spacer patterns, forming a supporting pattern on the mask layer, such that the supporting pattern overlaps at least two spacer patterns of the plurality of spacer patterns, transferring the supporting pattern and the plurality of spacer patterns onto the first sacrificial layer to form a sacrificial supporting pattern a plurality of sacrificial gate patterns, respectively, and transferring the sacrificial supporting pattern and plurality of sacrificial gate patterns onto the semiconductor layer to form a supporting gate and a plurality of gates, respectively.

According to yet another aspect of embodiments, there is provided a method for fabricating a semiconductor device, including forming, on a substrate, a semiconductor layer and a first sacrificial layer sequentially, forming a spacer pattern spaced apart from in a certain pitch on the first sacrificial layer, forming a mask layer that covers the spacer pattern, forming a supporting pattern on the mask layer, wherein the supporting pattern is overlapped with at least a portion of the spacer pattern, transferring the supporting pattern and the spacer pattern onto the first sacrificial layer to form a sacrificial gate pattern and a sacrificial supporting pattern and transferring the sacrificial gate pattern and the sacrificial supporting pattern onto the semiconductor layer to form a gate and a supporting gate, wherein the gate and the supporting gate are extended by a first length in a first direction.

According to still another aspect of embodiments, there is provided a semiconductor device, including a substrate, a gate region comprising first and second side surfaces opposite each other in a first direction, wherein the gate region comprises, a plurality of gates extended in a second direction of intersecting with the first direction on the substrate, and spaced apart from each other by a first pitch in the first direction, and the plurality of gates comprise a first outermost gate most adjacent to the first side surface, and a second outermost gate most adjacent to the second side surface, a first supporting gate spaced apart from the first outermost gate with the first pitch in the first direction, and extended in the second direction, and a second supporting gate spaced apart from the second outermost gate with the first pitch in the first direction, and extended in the second direction, wherein a width of each of a plurality of gates is less than a width of the first and second supporting gates.

According to still another aspect of embodiments, there is provided a semiconductor device, including a substrate comprising first and second regions that are spaced apart from each other, a plurality of gates spaced apart from one another by a first pitch in the first direction on the first region, and extended in a second direction of intersecting with the first direction, a plurality of second gates spaced apart from one another by a second pitch in the first direction on the second region, and extended in the second direction, wherein the second pitch is different form the first pitch, a first supporting gate formed between the first and second regions, more adjacent to the first region than the second region, and extended in the second direction, wherein a width of the first supporting gate is greater than a width of each of the plurality of gates, and a second supporting gate formed between the first supporting gate and the second region, and extended in the second direction, wherein a width of the second supporting gate is greater than a width of each of the plurality of second gates.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinafter, a semiconductor device according to some exemplary embodiments will be described with reference to FIGS. 1 to 4.

Figure 1:
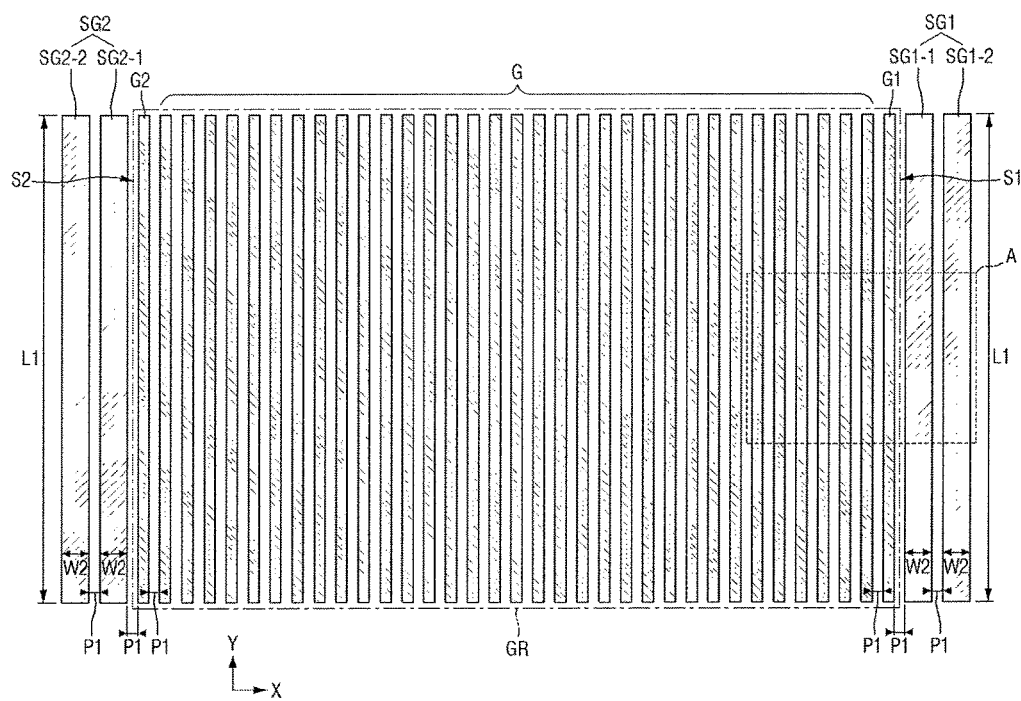
FIG. 1 illustrates a layout diagram of a semiconductor device according to some exemplary embodiments.
Figure 2:
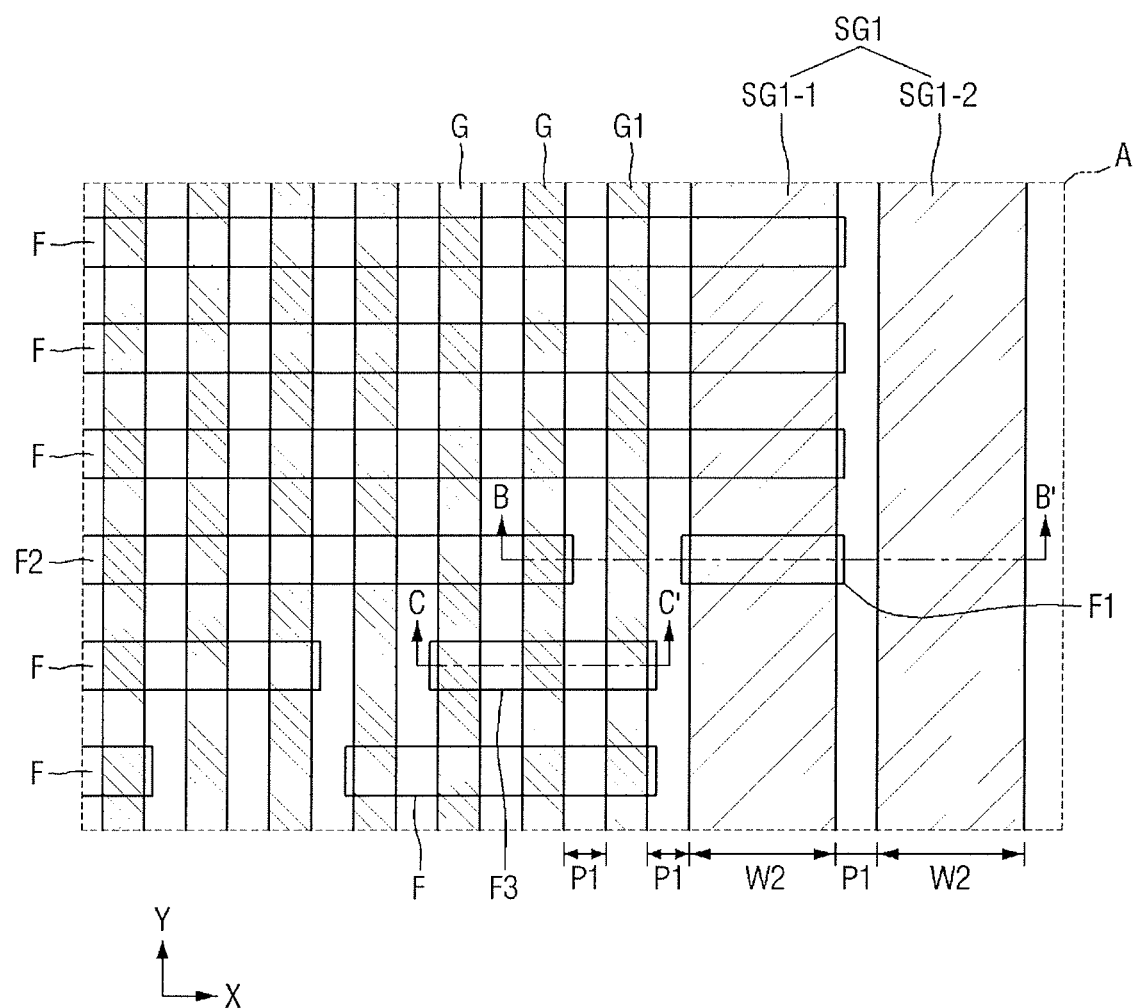
FIG. 2 illustrates an enlarged layout diagram of the encircled section A of FIG. 1.
Figure 3:
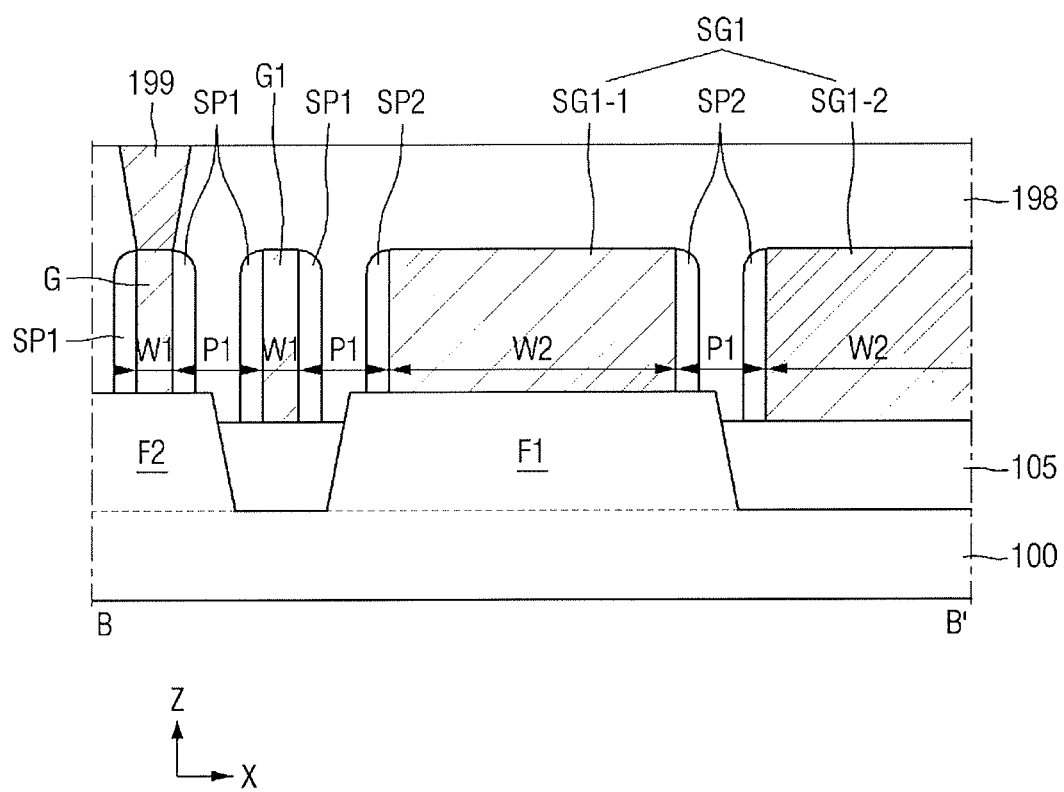
FIG. 3 illustrates a cross sectional view taken on line B-B' of FIG. 2.
Figure 4:
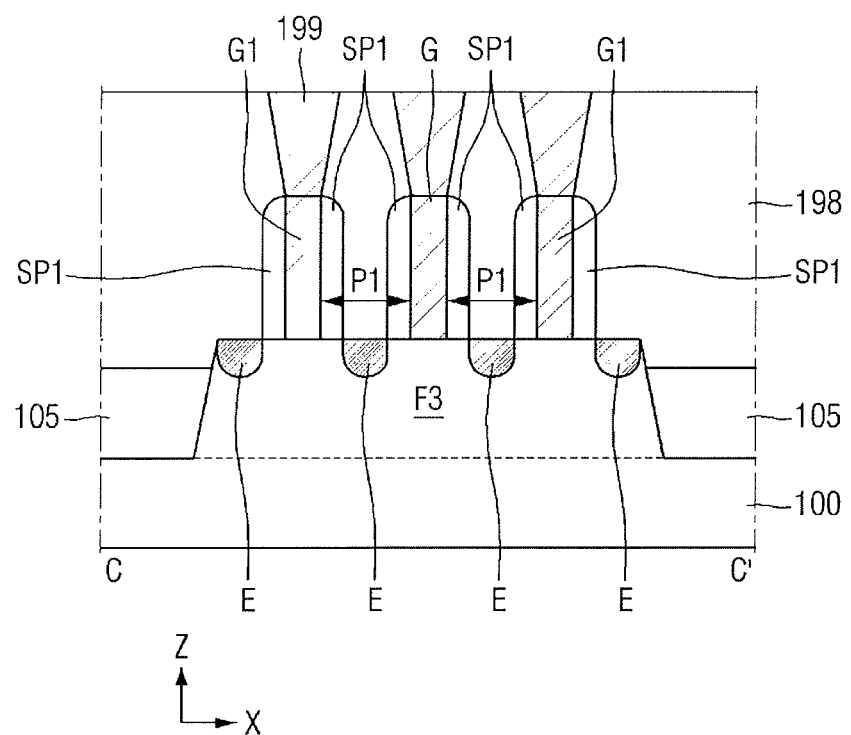
FIG. 4 illustrates a cross sectional view taken on line C-C' of FIG. 2.

FIG. 1 is a layout diagram of a semiconductor device according to some exemplary embodiments, and FIG. 2 is an enlarged layout diagram of the encircled section A of FIG. 1. FIG. 3 is a cross sectional view along line B-B' of FIG. 2, and FIG. 4 is a cross sectional view along line C-C' of FIG. 2.

Referring to FIGS. 1-4, a semiconductor device according to some exemplary embodiments may include a substrate 100, a gate region GR, and supporting gates SG1 and SG2.

For example, the substrate 100 may be a bulk silicon or a silicon-on-insulator (SOI). In another example, the substrate 100 may be a silicon substrate, or may include other materials, e.g., silicon germanium, indium antimonide, lead telluride compound, indium arsenide, indium phosphide, gallium arsenide, or gallium antimonide. In yet another example, the substrate 100 may be a base substrate having an epitaxial layer formed thereon.

The gate region GR may be formed on the substrate 100. The gate region GR is a region that includes a gate G, a first outermost gate G1, and a second outermost gate G2 to be explained below. The gate region GR may be defined by the gate G, the first outermost gate G1, and the second outermost gate G2 of identical length.

The gate region GR including the gate G, the first outermost gate G1, and the second outermost gate G2 may thus be a rectangular region. However, the above examples are provided only for illustrative purpose, and exemplary embodiments are not limited thereto. That is, a shape of the gate region GR may be, e.g., a square shape, and may be a shape of another figure that has a first side surface S1 and a second side surface S2.

The gate region GR may include the first side surface S1 and the second side surface S2 that are opposed to each other in a first direction X, e.g., the first and second side surfaces S1 and S2 may be spaced apart from each other along the first direction X to define opposite sides of the gat region GR. That is, the first side surface S1 and the second side surface S2 may be a portion corresponding to both side surfaces in the first direction X when the gate region GR is a rectangle.

The gate region GR may be formed between the supporting gates SG1 and SG2 that will be described below. That is, a side surface of the gate region GR may be surrounded by the supporting gates SG1 and SG2. The supporting gates SG1 and SG2 may be formed adjacent to the first side surface S1 and the second side surface S2 of the gate region GR, respectively.

The gate G may be formed in the gate region GR. A plurality of gates G may be provided. The plurality of gates G may be spaced apart from one another in the first direction X. The gate G may extend in the second direction Y. The plurality of gates G may extend in parallel to each other in the second direction Y. A length of each gate G in the second direction Y may be equal to a first length L1. Further, an end of each gate G in the second direction Y may be aligned with a certain location on the second direction Y. That is, each gate G may be completely overlapped, e.g., aligned, with each other in the second direction Y. Accordingly, the gate region GR may be defined as a rectangle having a side surface in the first direction X and a side surface in the second direction Y.

The gates G may be spaced apart from one another by a first pitch P1. That is, all the pitches between a plurality of gates G may be equal to each other. This is attributable to the forming process of the gates G. Since all gates G are spaced apart by the same pitch, uniformity of the gates G may be enhanced, and reliability of the gates G may be enhanced.

The gates G may all have the same first width W1. The first width W1 represents a width of the gate G in the first direction X. This is attributable to the forming process of the gates G, and since the gates G are all formed with the same width, uniformity of the gates G may be enhanced. As a result, reliability of the semiconductor device may be also enhanced.

The closest gate to the first side surface S1 of the gate region GR may be defined as the first outermost gate G1. The closest gate to the second side surface S2 of the gate region GR may be defined as the second outermost gate G2. The first outermost gate G1 and the second outermost gate G2 have a similar characteristic to the gate G, but will be described with new reference numerals and names for convenience of explanation.

The first outermost gate G1 may be spaced apart from the plurality of gates G by the first pitch P1 in the first direction X, and may be formed closest to the first side surface S1 of the gate region GR. The first outermost gate G1 may extend in the second direction Y. The first outermost gate G1 may extend by the first length L1 in the second direction Y. That is, both the gates G and the first outermost gate G1 may extend with the same length in the second direction Y, and may be spaced apart from each other by the same pitch in the first direction X.

The second outermost gate G2 may be spaced apart from the plurality of gates G by the first pitch P1 in the first direction X, and may be formed closest to the second side surface S2 of the gate region GR. The second outermost gate G2 may extend in the second direction Y. The second outermost gate G2 may extend by the first length L1 in the second direction Y. That is, the gate G, the first outermost gate G1, and the second outermost gate G2 may all extend with the same length in the second direction Y, and may all be spaced apart by the same pitch in the first direction X.

The supporting gates SG1 and SG2 may be formed adjacent to the first side surface S1 and the second side surface S2 of the gate region GR. The supporting gates SG1 and SG2 may include a first supporting gate SG1 formed on the first side surface S1, and a second supporting gate SG2 formed on the second surface S2.

The first supporting gate SG1 may be spaced apart from the first outermost gate G1 by the first pitch P1 in the first direction X. The first supporting gate SG1 may extend in the second direction Y. The first supporting gate SG1 may extend by the first length L1 in the second direction Y. That is, the first supporting gate SG1, the first outermost gate G1, and the gate G may all be spaced apart from one another with the same pitch in the first direction X, and may all extend by the same length in the second direction Y.

A plurality of first supporting gates SG1 may be provided. The first supporting gate SG1 may include a first inner supporting gate SG1-1 and a first outer supporting gate SG1-2. The first inner supporting gate SG1-1 may be formed on the side surface of the first outermost gate G1, and the first outer supporting gate SG1-2 may be formed on the side surface of the first inner supporting gate SG1-1. While two first supporting gates SG1 are illustrated in FIG. 1, it is only an example and the present disclosure is not limited thereto. That is, the number of the first supporting gate SG1 is not limited.

The first inner supporting gate SG1-1 and the first outer supporting gate SG1-2 may be spaced apart from each other with the first pitch P1 in the first direction X. That is, the gate G, the first outermost gate G1, and the first supporting gate SG1 may all be spaced apart from one another with the first pitch P1 in the first direction X.

The first inner supporting gate SG1-1 and the first outer supporting gate SG1-2 may all extend by the first length L1 in the second direction Y. That is, the gate G, the first outermost gate G1, and the first supporting gate SG1 may all have the first length L1 in the second direction Y.

A plurality of second supporting gate SG2 may be provided. The second supporting gate SG2 may include a second inner supporting gate SG2-1 and a second outer supporting gate SG2-2. The second inner supporting gate SG2-1 may be formed on the side surface of the second outermost gate G2, and the second outer supporting gate SG2-2 may be formed on the side surface of the second inner supporting gate SG2-1.

The second supporting gate SG2 may be spaced apart from the second outermost gate G2 by the first pitch P1 in the first direction X. The second supporting gate SG2 may extend in the second direction Y. The second supporting gate SG2 may extend by the second length L2 in the second direction Y. That is, the second supporting gate SG2, the second outermost gate G2, and the gate G may all be spaced apart from one another with the same pitch in the first direction X, and may all extend by the same length in the second direction Y.

The second inner supporting gate SG2-1 and the second outer supporting gate SG2-2 may be spaced apart from each other with the first pitch P1 in the first direction X. That is, the gate G, the second outermost gate G2, and the second supporting gate SG2 may all be spaced apart from one another with the first pitch P1 in the first direction X.

In a method for fabricating a semiconductor device according to some exemplary embodiments, the supporting gates SG1 and SG2 may be spaced apart from the first outermost gate G1 and the second outermost gate G2 by the first pitch P1, as the supporting gates SG1 and SG2 are formed by overlapping with patterns needed for the formation of the plurality of gates G. That is, according to overlapping with the patterns of the same pitch, the pitches of the supporting gate SG1 and SG2 may be equal to that same pitch. In other words, each of the supporting gates SG1 and SG2 is formed by a single mask defined by overlapping patterns, which includes a plurality of patterns for forming the gates G at the first pitch P1, the pitches of the supporting gate SG1 and SG2 are equal to the same first pitch P1, as will be described in more detail below with reference to FIGS. 21-25.

Likewise, in a method for fabricating a semiconductor device according to some exemplary embodiments, the first inner supporting gates SG1-1 may be spaced apart from the first outer supporting gate SG1-2 by the first pitch P1 and the second inner supporting gate SG2-1 may be spaced apart from the second outer supporting gate SG2-2 by the first pitch P1, and it may be attributable to the fact that the supporting gates SG1 and SG2 are formed by overlapping with patterns needed for the formation of the gate G. That is, according to overlapping with the patterns of the same pitch, the pitches of the supporting gate SG1 and SG2 may be equal to that same pitch.

The second inner supporting gate SG2-1 and the second outer supporting gate SG2-2 may all extend by the first length L1 in the second direction Y. That is, the gate G, the second outermost gate G2, and the second supporting gate SG2 may all have the first length L1 in the second direction Y.

The supporting gates SG1 and SG2 may be formed to prevent interference between the plurality of gates G having the first pitch P1 and other components or regions in the semiconductor device. That is, the supporting gates SG1 and SG2 may minimize damages to the gate region GR or abnormal operation that may be caused in the formation process, etching process or operation process, by forming or driving of the other regions.

The gate G, the first outermost gate G1, the second outermost gate G2, and the supporting gates SG1 and SG2 may all be formed from the same material. The gate G, the first outermost gate G1, the second outermost gate G2, and the supporting gates SG1 and SG2 may include a conductive material. As illustrated, the gate G, the first outermost gate G1, the second outermost gate G2, and the supporting gates SG1 and SG2 may be a single layer, but are not limited thereto. For example, the gate G, the first outermost gate G1, the second outermost gate G2, and the supporting gates SG1 and SG2 may include at least one of TiN, WN, TaN, Ru, TiC, TaC, Ti, Ag, Al, TiAl, TiAlN, TiAlC, TaCN, TaSiN, Mn, Zr, W, and Al. In another example, the gate G, the first outermost gate G1, the second outermost gate G2, and the supporting gates SG1 and SG2 may each be formed from Si, SiGe, and so on, rather than metal. The gate G, the first outermost gate G1, the second outermost gate G2, and the supporting gates SG1 and SG2 may be formed by replacement process, but they are not limited thereto.

Referring to FIGS. 2 to 4, the semiconductor device according to some exemplary embodiments may include fins F, F1, F2 and F3 in the lower portion of the gate G, the first outermost gate G1, the second outermost gate G2, and the supporting gates SG1 and SG2. The fins F, F1, F2 and F3 may be elongated in the first direction X. That is, the fins F, F1, F2 and F3 may include a long side extending in the first direction X, and a short side extending in the second direction Y. The fins F, F1, F2 and F3 may be spaced apart from one another in the second direction Y. Some of the fins F, F1, F2 and F3 may also be spaced apart from one another in the first direction X.

In detail, the first fin F1 and the second fin F2 may be spaced apart from each other in the first direction X. A spacing of the fins F, F1, F2 and F3 in the first direction X is not limited to those described in FIG. 2. The fins F, F1, F2 and F3 may be freely spaced apart in the first direction X according to use thereof. One gate may be located between the fins F, F1, F2 and F3 and the fins F, F1, F2 and F3, or two gates may be located therebetween. For example, only the first outermost gate G1 may be located between the first fin F1 and the second fin F2. In another example, two gates G may be located between the third fin F3 and an adjacent fin F in the first direction X. The fins F, F1, F2 and F3 and the supporting gates SG1 and SG2 may or may not be overlapped.

The fins F, F1, F2 and F3 may be formed to protrude further than, e.g., above, the substrate 100 in a third direction Z, as illustrated in FIG. 3. The fins F, F1, F2 and F3 may be formed by partially etching the substrate 100, and may include an epitaxial layer grown from the substrate 100. The fins F, F1, F2 and F3 may include an element semiconductor material, e.g., silicon or germanium. Further, the fins F, F1, F2 and F3 may include a compound semiconductor, e.g., IV-IV group compound semiconductor or III-V group compound semiconductor. For example, in the case of the IV-IV group compound semiconductor, the fins F, F1, F2 and F3 may be a binary compound or a ternary compound including at least two or more of, e.g., carbon (C), silicon (Si), germanium (Ge) or tin (Sn), or these compounds doped with IV group element. In another example, in the case of the III-V group compound semiconductor, the fins F, F1, F2 and F3 may be one of a binary compound, ternary compound and quaternary compound which is formed by a combination of at least one of, e.g., aluminum (Al), gallium (Ga), and indium (In) as a III group element, with one of, e.g., phosphorus (P), arsenic (As) and antimony (Sb) as a V group element.

In the following description, it is assumed that the fins F, F1, F2 and F3 of a semiconductor device according to exemplary embodiments include silicon.

Referring to FIGS. 3-4, a field insulating film 105 may at least partially surround the sidewalls of the fins F, F1, F2 and F3. The fins F, F1, F2 and F3 may be defined by the field insulating film 105. The field insulating film 105 may include, e.g., one of oxide film, nitride film, oxynitride film, or a combination thereof.

The gate G, the first outermost gate G1, the second outermost gate G2, and the supporting gates SG1 and SG2 may be formed on the fins F, F1, F2 and F3 or the field insulating film 105. That is, the gate G, the first outermost gate G1, the second outermost gate G2, and the supporting gates SG1 and SG2 may all be formed in a spacing portion between the fins F, F1, F2 and F3 in the second direction Y on the field insulating film 105. Some of the gate G, the first outermost gate G1, the second outermost gate G2, and the supporting gates SG1 and SG2 may be formed in a spacing portion between the fins F, F1, F2 and F3 in the first direction X on the field insulating film 105.

For example, referring to FIG. 3, the first inner supporting gate SG1-1 of the first supporting gates SG1 may be formed on the first fin F1, and the gate G may be formed on the second fin F2. The first outermost gate G1 and the first outer supporting gate SG1-2 of the first supporting gates SG1 may be formed on the field insulating film 105. However, the above examples are provided only for illustrative purpose, and location of the fins F, F1, F2 and F3 and the field insulating film may vary.

A first spacer SP1 may be formed on both sides of the gate G and the first outermost gate G1. Although not illustrated, the first spacer SP1 may be likewise formed on both sides of the outermost gate G2. The first spacer SP1 may extend along the gate G and the first outermost gate G1 in the second direction Y. For example, the first spacer SP1 may include at least one of silicon nitride (SiN), silicon oxynitride (SiON), silicon oxide (SiO$_2$), silicon oxycarbonitride (SiOCN), or a combination thereof.

A second spacer SP2 may be formed on both sides of the first supporting gate SG1. Although not illustrated, the second spacer SP2 may be likewise formed on both sides of the supporting gate SG2. The second spacer SP2 may extend along the first supporting gate SG1 and the second supporting gate SG2 in the second direction Y. For example, the second spacer SP2 may include at least one of silicon nitride (SiN), silicon oxynitride (SiON), silicon oxide (SiO$_2$), silicon oxycarbonitride (SiOCN), or a combination thereof.

A gate contact 199 may be formed so as to be in contact with an active gate G through an interlayer insulating film 198. For example, as illustrated in FIG. 3, when only the gate G is used as an active gate, the gate contact 199 may be formed so as to be brought into contact with the gate G through the interlayer insulating film 198. That is, the gate contact 199 may not be formed on the first outermost gate G1 or on the supporting gate SG1.

Referring to FIG. 4, a source/drain E may be formed on both sides of the gate G and the first outermost gate G1. The source/drain E may be formed on both sides of the first outermost gate G1. Although not illustrated, the source/drain E may also be formed on both sides of the second outermost gate G2. The source/drain E may be formed on the fins F, F1, F2 and F3. The source/drain E may include an epitaxial layer formed on an upper surface of the fins F, F1, F2 and F3. As a result, the gate G and the first outermost gate G1 may be utilized as an active gate. Accordingly, the gate contact 199 may be formed so as to be in contact with the gate G and the first outermost gate G1 through the interlayer insulating film 198.

Hereinbelow, a semiconductor device according to another exemplary embodiment will be explained with reference to FIGS. 5 and 6. For convenience of explanation, only differences relative to the embodiment described above with reference to FIGS. 1-4 will be mainly explained below.

Figure 5:
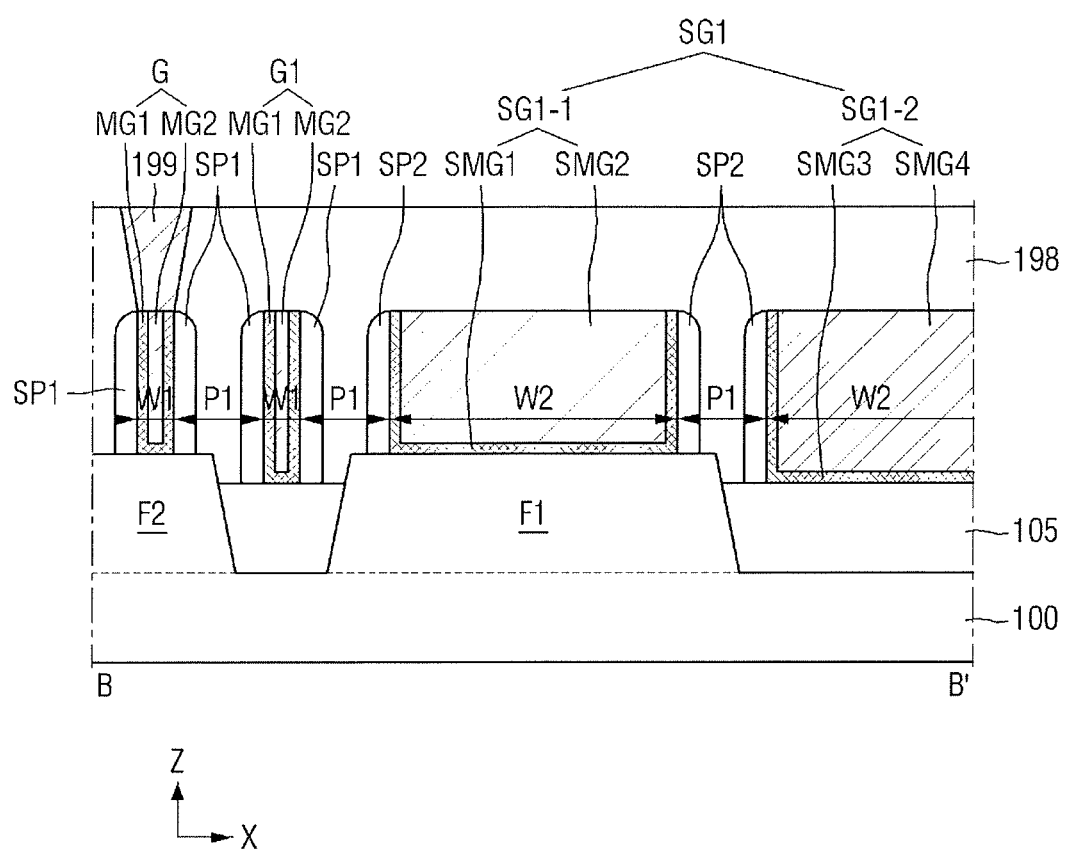
FIG. 5 illustrates a cross sectional view of a semiconductor device according to some exemplary embodiments.
Figure 6:
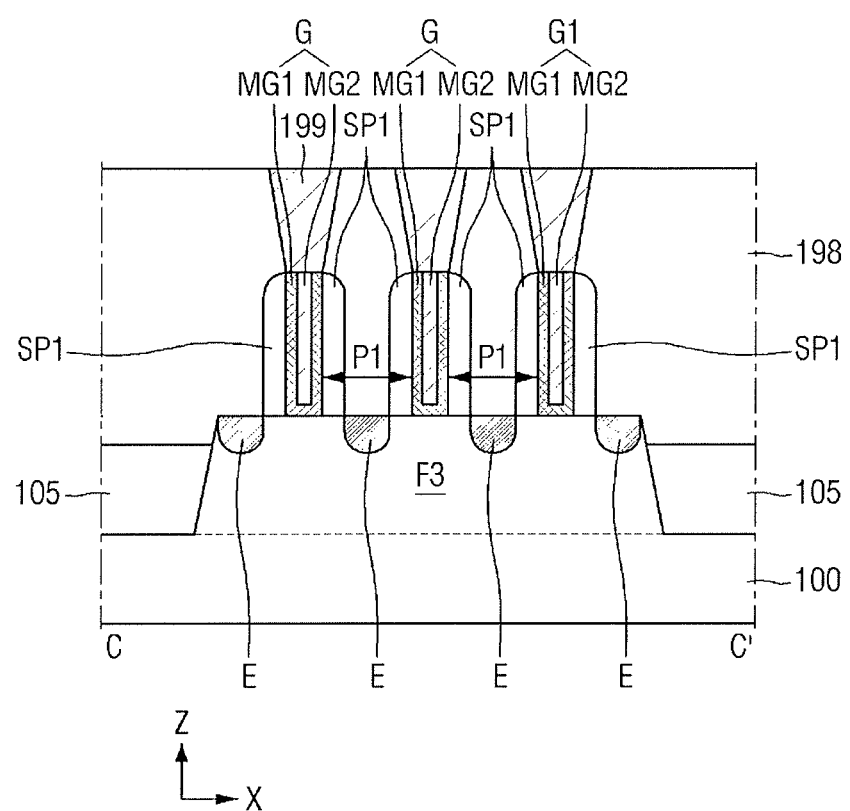
FIG. 6 illustrates a cross sectional view of a semiconductor device according to some exemplary embodiments.

FIG. 5 is a cross sectional view provided to explain a semiconductor device according to some exemplary embodiments, and FIG. 6 is a cross sectional view provided to explain a semiconductor device according to some exemplary embodiments. It is noted that FIGS. 5-6 correspond to lines B-B' and C-C' of FIG. 2, respectively.

Referring to FIGS. 5 and 6, the gate G and the first outermost gate G1 may include a work function metal MG1 and a fill metal MG2. The work function metal MG1 plays a role of adjusting a work function, and the fill metal MG2 plays a role of filling the space formed by the work function metal MG1. The work function metal MG1 may be, e.g., an N-type work function metal, a P-type work function metal, or a combination thereof. For example, the work function metal MG1 may include at least one of TiN, WN, TiAl, TiAlN, TaN, TiC, TaC, TaCN, TaSiN, or a combination thereof, but not limited thereto. Further, the fill metal MG2 may include at least one of, e.g., W, Al, Cu, Co, Ti, Ta, poly-Si, SiGe, or a metal alloy, but not limited thereto.

Likewise, the first supporting gate SG1 may also include the supporting work function metals SMG1 and SMG3 and the supporting fill metals SMG2 and SMG4. The supporting work function metals SMG1 and SMG3 may be formed conformally on the side surface of the second spacer SP2 and the upper surface of the fins F, F1, F2 and F3, and the supporting fill metals SMG2 and SMG4 may be filling the space defined by the supporting work function metals SMG1 and SMG3.

In detail, the first inner supporting gate SG1-1 may include the first supporting work function metal SMG1 and the first supporting fill metal SMG2, and the first outer supporting gate SG1-2 may include the second supporting work function metal SMG3 and the second supporting fill metal SMG 4. Although not illustrated, the second supporting gate SG2 may also include the work function metal and the fill metal. The gate contact 199 may be formed so as to be in contact with the gate G through the interlayer insulating film 198, and may not be formed on the first outermost gate G1 and the supporting gate SG1.

Hereinbelow, a semiconductor device according to another exemplary embodiment will be explained with reference to FIG. 7. For convenience of explanation, only differences relative to the embodiment described above with reference to FIG. 1 will be mainly explained below.

Figure 7:
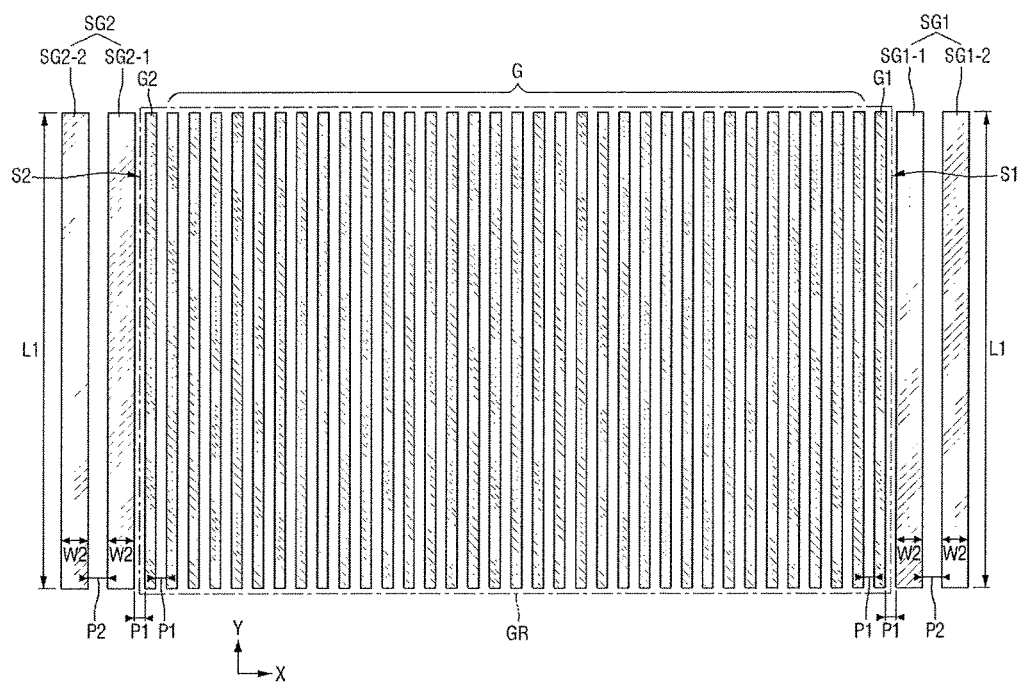
FIG. 7 illustrates a layout diagram of a semiconductor device according to some exemplary embodiments.

FIG. 7 is a layout diagram provided to explain a semiconductor device according to some exemplary embodiments.

Referring to FIG. 7, the plurality of supporting gates SG1 and SG2 of the semiconductor device according to some exemplary embodiments may be spaced apart from one another with a second pitch P2. That is, the first inner supporting gate SG1-1 and the first outermost gate G1 may be spaced apart with the first pitch P1, and the second inner supporting gate SG2-1 may still be spaced apart with the first pitch P1. However, the first inner supporting gate SG1-1 and the first outer supporting gate SG1-2 may be spaced apart from each other with the second pitch P2.

The second pitch P2 may be greater than the first pitch P1. This may be attributable to the fact that the inner supporting gates SG1-1 and SG2-1 are formed to be overlapped with a pattern needed to form the gate G, but the outer supporting gates SG1-2 and SG2-2 are not overlapped with a pattern needed to form the gate G.

That is, only some of the plurality of the first supporting gates SG1, and some of the plurality of the second supporting gates SG2 may be overlapped with a pattern needed to form the gate G. Accordingly, the first inner supporting gate SG1-1 and the second inner supporting gate SG2-1 may each be spaced apart from the first outermost gate G1 and the second outermost gate G2 with the first pitch P1. The first outer supporting gate SG1-2 and the second outer supporting gate SG2-2 may each be spaced apart from the first inner supporting gate SG1-1 and the second inner supporting gate SG2-1 with the second pitch P2. At this time, the second pitch P2 may be greater than the first pitch P1.

Hereinbelow, a semiconductor device according to another exemplary embodiment will be explained with reference to FIG. 8. For convenience of explanation, only differences relative to the embodiment described above with reference to FIG. 1 will be mainly explained below.

Figure 8:
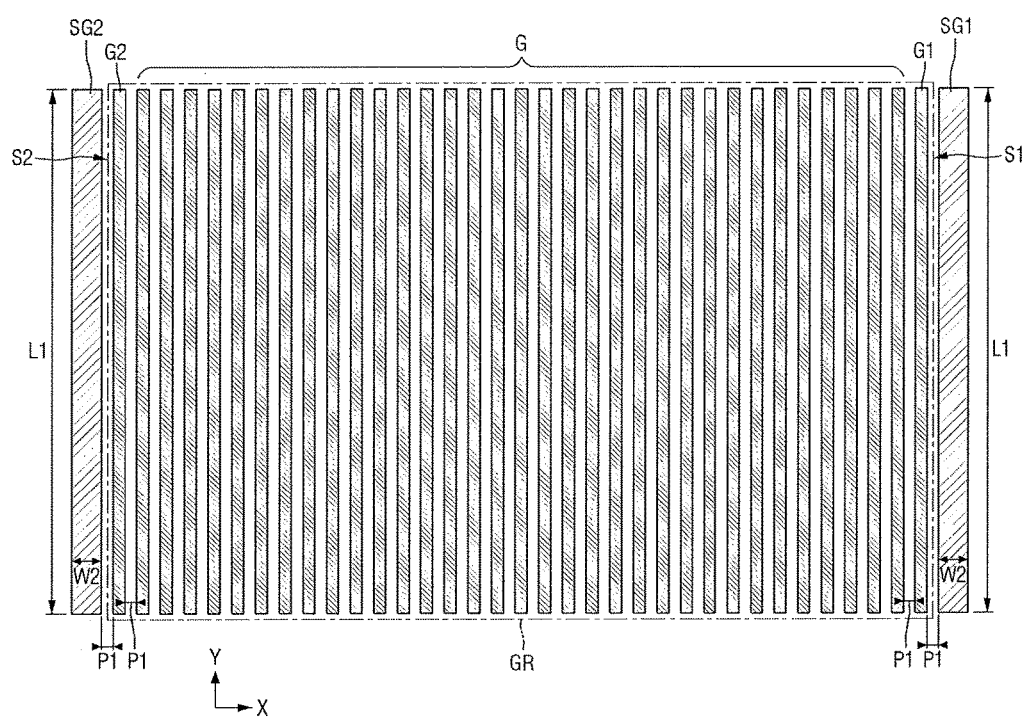
FIG. 8 illustrates a layout diagram of a semiconductor device according to some exemplary embodiments.

FIG. 8 is a layout diagram provided to explain a semiconductor device according to some exemplary embodiments.

Referring to FIG. 8, the first supporting gate SG1 and the second supporting gate SG2 of the semiconductor device according to some exemplary embodiments may be one pattern, respectively. The first supporting gate SG1 may not be plural, but singular. That is, by minimizing the region occupied by the first supporting gate SG1, speed and capacity of the semiconductor device may be enhanced by increasing integration density of the semiconductor device. Likewise, the second supporting gate SG2 may not be plural, but singular. That is, by minimizing the region occupied by the second supporting gate SG2, speed and capacity of the semiconductor device may be enhanced by increasing integration density of the semiconductor device.

Hereinbelow, a semiconductor device according to another exemplary embodiment will be explained with reference to FIG. 9. For convenience of explanation, only differences relative to the embodiment described above with reference to FIG. 1 will be mainly explained below.

Figure 9:
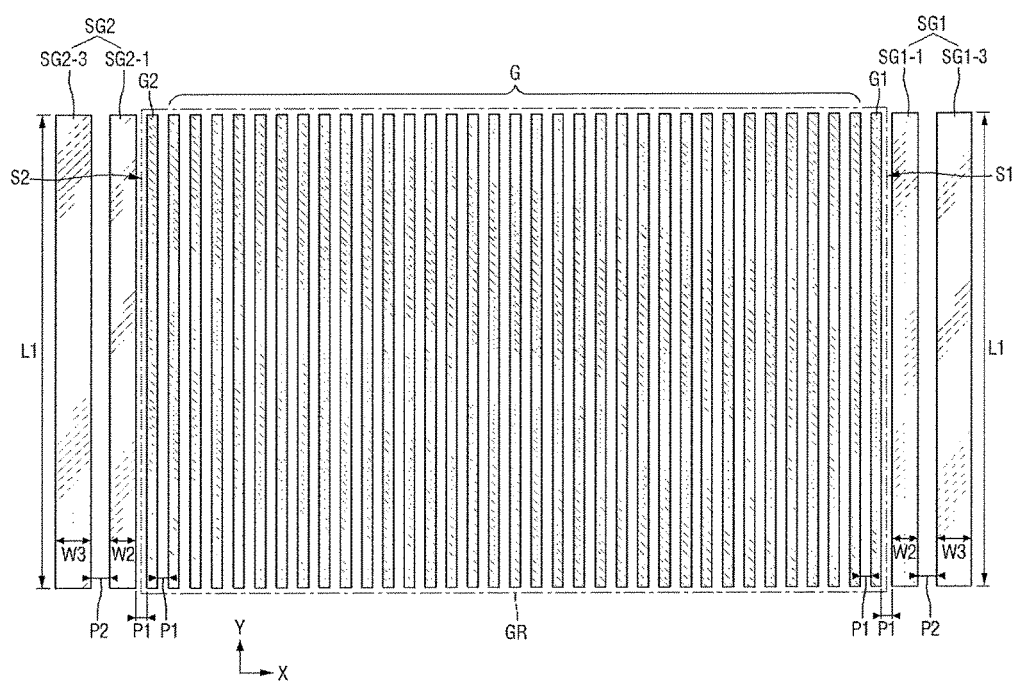
FIG. 9 illustrates a layout diagram of a semiconductor device according to some exemplary embodiments.

FIG. 9 is a layout diagram provided to explain a semiconductor device according to some exemplary embodiments.

Referring to FIG. 9, the first supporting gate SG1 may include the first outer supporting gate SG1-3, and the second supporting gate SG2 may include the second outer supporting gate SG2-3.

The first outer supporting gate SG1-3 may have the third width W3 in the first direction X. The third width W3 may be greater than the second width W2. However, exemplary embodiments are not limited to any specific example only. Accordingly, the third width W3 may be less than the second W2. The third width W3 may be different from the second width W2.

Likewise, the second outer supporting gate SG2-3 may have the third width W3 in the first direction X. The third width W3 may be greater than the second width W2. However, exemplary embodiments are not limited to any specific example only. Accordingly, the third width W3 may be less than the second W2. That is, the third width W3 may be different from the second width W2.

This may be attributable to the fact that the inner supporting gates SG1-1 and SG2-1 are formed to be overlapped with a pattern needed to form the gate G, but the outer supporting gates SG1-3 and SG2-3 are not overlapped with a pattern needed to form the gate G.

The inner supporting gates SG1-1 and SG2-1 and the outer supporting gates SG1-3 and SG2-3 may be formed by masks having different widths from each other. Accordingly, the inner supporting gates SG1-1 and SG2-1 and the outer supporting gates SG1-3 and SG2-3 may have different widths from each other according to a width of the mask pattern.

Alternatively, even when the inner supporting gates SG1-1 and SG2-1, and the outer supporting gates SG1-3 and SG2-3 are formed by the masks having the same width as each other, by overlapping with a pattern (i.e., spacer pattern, to be explained below) needed to form the gate G, the inner supporting gates SG1-1 and SG2-1 may form the inner supporting gates SG1-1 and SG2-1 of greater width than the widths of the masks that form the spacer pattern and the inner supporting gates SG1-1 and SG2-1. Accordingly, the inner supporting gates SG1-1 and SG2-1 and the outer supporting gates SG1-3 and SG2-3 may have different widths from each other.

Hereinbelow, a semiconductor device according to another exemplary embodiment will be explained with reference to FIG. 10. For convenience of explanation, only differences relative to the embodiment described above with reference to FIG. 1 will be mainly explained below.

Figure 10:
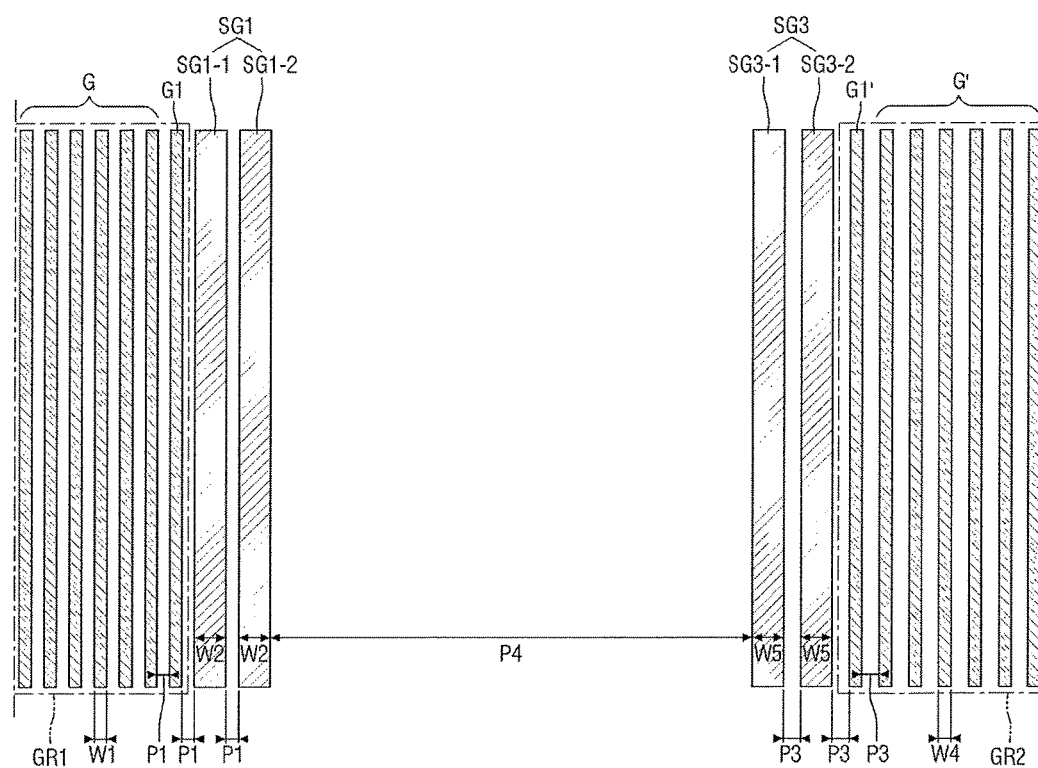
FIG. 10 illustrates a layout diagram of a semiconductor device according to some exemplary embodiments.

FIG. 10 is a layout diagram provided to explain a semiconductor device according to some exemplary embodiments.

Referring to FIG. 10, a semiconductor device according to some exemplary embodiments may include a first gate region GR1, a second gate region GR2, and a third supporting gate SG3.

The first gate region GR1 may be the same region as the gate region GR of FIG. 1. On a side surface of the first gate region GR1, the first supporting gate SG1 may be formed.

The second gate region GR2 may be spaced apart from the first gate region GR1. The second gate region GR2 may include a plurality of gates G' spaced from one another with a third pitch P3, and extending in parallel to a same length. The closest gate to the side surface of second gate region GR2 may be defined as a third outermost gate G1'. The third outermost gate G1' has a similar characteristic to the gate G, but will be described with new reference numerals and names for convenience of explanation. A width of the gate G' in the second gate region GR2 and the third outermost gate G1' may be a fourth width W4. The fourth width W4 may be equal to, or different from the first width W1.

The third outermost gate G1' may be spaced apart from a plurality of gates G by the third pitch P3, and may be formed closest to the side surface of the second gate region GR2. The third outermost gate G1' may be extended by the length of gate G'. That is, the gate G and the third outermost gate G1 may all be extended with the same length, and may be spaced apart with the same pitch.

The third supporting gate SG3 may be spaced apart from the third outermost gate G1' by the third pitch P3. The third supporting gate SG3 may be extended parallel to the third outermost gate G1' in the same direction. The third supporting gate SG3 may be extended by the same length as the third outermost gate G1'. That is, the third supporting gate SG3, the third outermost gate G1, and the gate G may all be spaced apart with the same pitch, and may be extended by the same length.

A plurality of third supporting gates SG3 may be provided. The third supporting gates SG3 may include the third inner supporting gate SG3-1 and the third outer supporting gate SG3-2. The third inner supporting gate SG3-1 may be formed on the side surface of the third outermost gate G1', and the third outer supporting gate SG3-2 may be formed on the side surface of the third inner supporting gate SG3-1.

The third inner supporting gate SG3-1 and the third outer supporting gate may all have a fifth width W5. The fifth width W5 may be greater than the fourth width W4.

The third supporting gate SG3 and the first supporting gate SG1 may be spaced apart from each other by a fourth pitch P4. The fourth pitch P4 may be greater than the first pitch P1, the second pitch P2, and the third pitch P3. However, exemplary embodiments are not limited to the example given above.

The third supporting gate SG3 and the first supporting gate SG1 may minimize the interference between the first gate region GR1 and the second gate region GR2 that are spaced apart from one another with different pitches.

Hereinbelow, a semiconductor device according to another exemplary embodiment will be explained with reference to FIG. 11. For convenience of explanation, only differences relative to the embodiment described above with reference to FIG. 10 will be mainly explained below.

Figure 11:
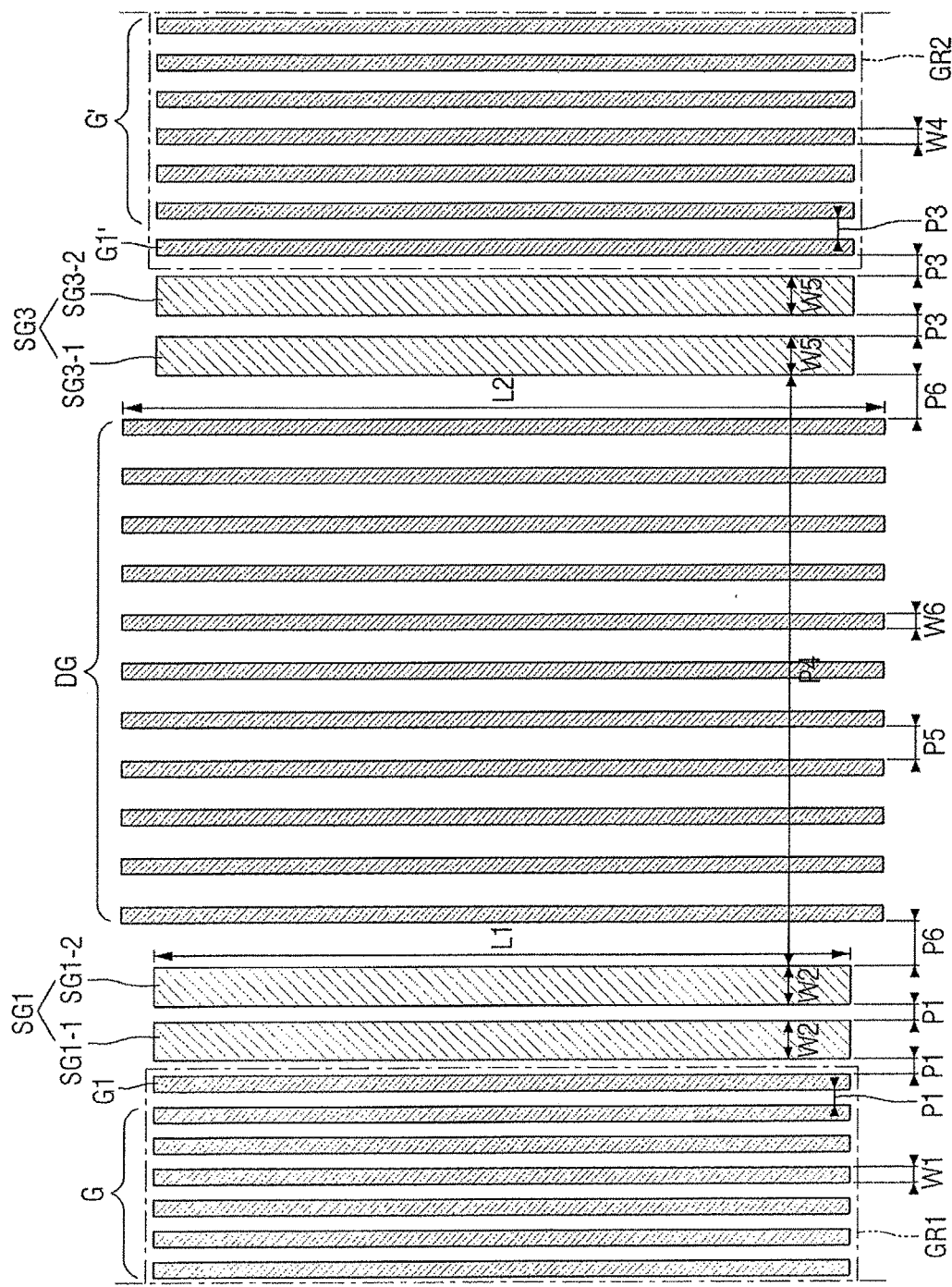
FIG. 11 illustrates a layout diagram of a semiconductor device according to some exemplary embodiments.

FIG. 11 is a layout diagram provided to explain a semiconductor device according to some exemplary embodiments.

Referring to FIG. 11, the semiconductor device according to some exemplary embodiments may additionally include a dummy gate DG. The dummy gate DG may be located between the first gate region GR1 and the second gate region GR2.

In detail, the dummy gate DG may be located between the first supporting gate SG1 and the third supporting gate SG3. The dummy gate DG may be formed to minimize loading effect in all etching process of the semiconductor device. That is, since the etch rates may be different from each other even in the portions that are not actually used according to densities of protruded patterns, the dummy gate DG may be formed to minimize this.

In the first gate region GR1, the gate G, the first outermost gate G1, and the first supporting gate SG1 may have the first length L1. Likewise, the gate G', the third outermost gate G1', and the third supporting gate SG3 in the second gate region GR2 may have the first length L1. The dummy gate DG may have a second length L2. The second length L2 may be different from the first length L1. As illustrated in the drawings, the second length L2 may be greater than the first length L1, but not limited thereto. In some exemplary embodiments, the first length L1 and the second length L2 may be the same, or the second length L2 may be less than the first length L1.

A plurality of dummy gates DG may have a certain width. A plurality of dummy gates DG may have a sixth width W6. The sixth width W6 may be less than the second width W2 and the fifth width W5. The sixth width W6 may be equal to one of the first width W1 and the fourth width W4. However, exemplary embodiments are not limited to the example given above.

A plurality of dummy gates DG may be spaced apart from one another in the same pitch. A plurality of dummy gates DG may be spaced apart from one another by the fifth pitch P5. In this case, the fifth pitch P5 may be equal to one of the first pitch P1 and the third pitch P3. However, exemplary embodiments are not limited to the example given above.

The first outer supporting gate SG1-2 and the dummy gate DG may be spaced apart from each other by the sixth pitch P6. The third outer supporting gate SG3-2 and the dummy gate DG may be spaced apart from each other by the sixth pitch P6. At this time, the sixth pitch P6 may be a pitch defined by the design rule. Accordingly, since the pitches are set to ensure margin, the pitch between the first outer supporting gate SG1-2 and the dummy gate DG, and the pitch between the third outer supporting gate SG3-1 and the dummy gate DG may be not same. That is, one or both may be spaced apart with a greater pitch than the sixth pitch P6.

Hereinbelow, a method for fabricating a semiconductor device according to some exemplary embodiments will be described with reference to FIGS. 1-5 and 12-25.

FIGS. 12 to 25 are cross-sectional views illustrating intermediate stages in a method of fabricating a semiconductor device according to some exemplary embodiments.

Figure 12:
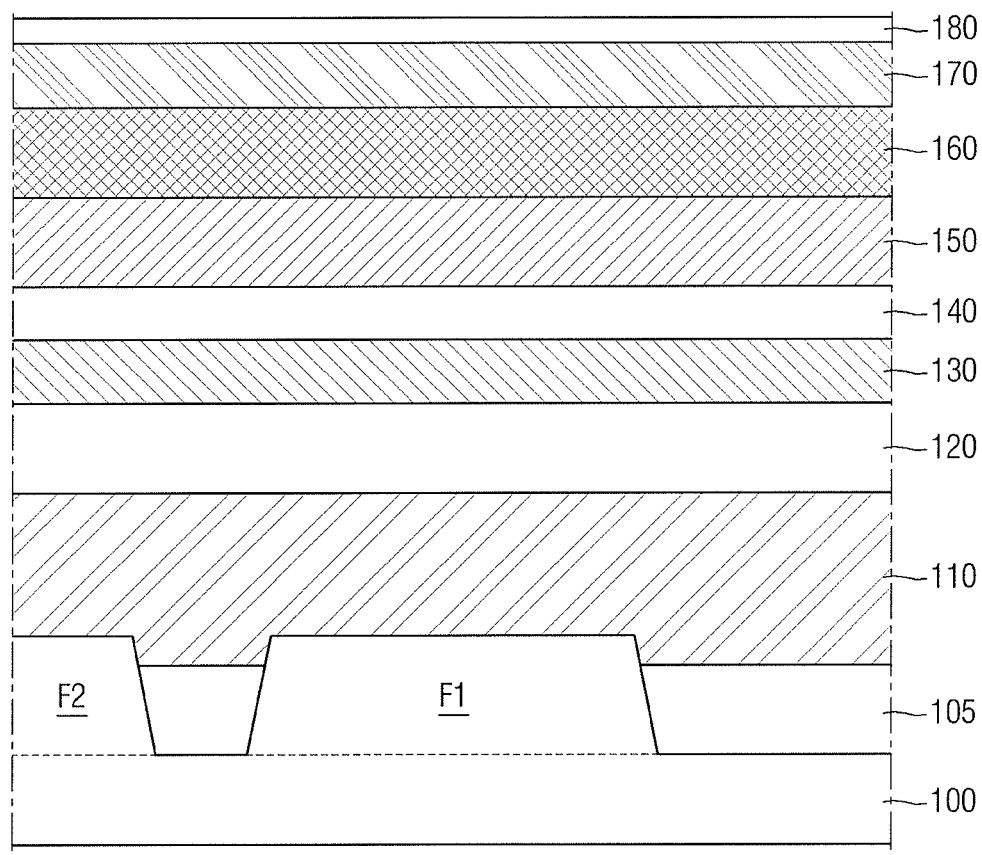
FIGS. 12 to 25 illustrate views of intermediate stages in a method for fabricating a semiconductor device according to some exemplary embodiments.

Referring to FIG. 12, several layers may be formed by stacking on the substrate 100. To explain it sequentially, the fins F1 and F2 may be formed on the substrate 100, and the field insulating film 105 may be formed between the fins F1 and F2, e.g., on the substrate 100. Next, a gate layer 110, a capping layer 120, a first sacrificial pattern layer 130, and a first sacrificial capping layer 140, a second sacrificial pattern layer 150, a first mask layer 160, a second sacrificial capping layer 170, and an anti-reflection layer 180 may be formed sequentially on the fins F1 and F2, and the field insulating film 105.

At this time, the gate layer 110, the first sacrificial pattern layer 130, and the second sacrificial pattern layer 150 may include any one of, e.g., polycrystalline silicon, amorphous carbon layer (ACL) and spin-on hardmask (SOH). The capping layer 120 and the first sacrificial capping layer 140 may include any one of, e.g., silicon oxide ($SiO_x$), silicon oxynitride (SiON), and silicon nitride ($Si_xN_y$).

The first mask layer 160 may be configured as a plurality of layers. The plurality of layers may each be formed of at least one of silicon-containing material, e.g., silicon oxide ($SiO_x$), silicon oxynitride (SiON), silicon nitride ($Si_xN_y$), tetraethyl orthosilicate (TEOS), or polycrystalline silicon and so on, carbon-containing material such as amorphous carbon layer (ACL) or spin-on hardmask (SOH), or metal. For example, a lower layer of the plurality of layers may be formed of silicon nitride layer, and the lower layer may additionally include a thin silicon oxide under the silicon nitride. A middle layer may be formed of silicon oxide. An upper layer may be formed of polycrystalline silicon. However, exemplary embodiments are not limited to the example given above.

The anti-reflection layer 180 may include layers to prevent light from reflecting against an underlying layer during photolithography process. The anti-reflection layer 180 may be formed of bottom anti-reflective coating (BARC).

Figure 13:
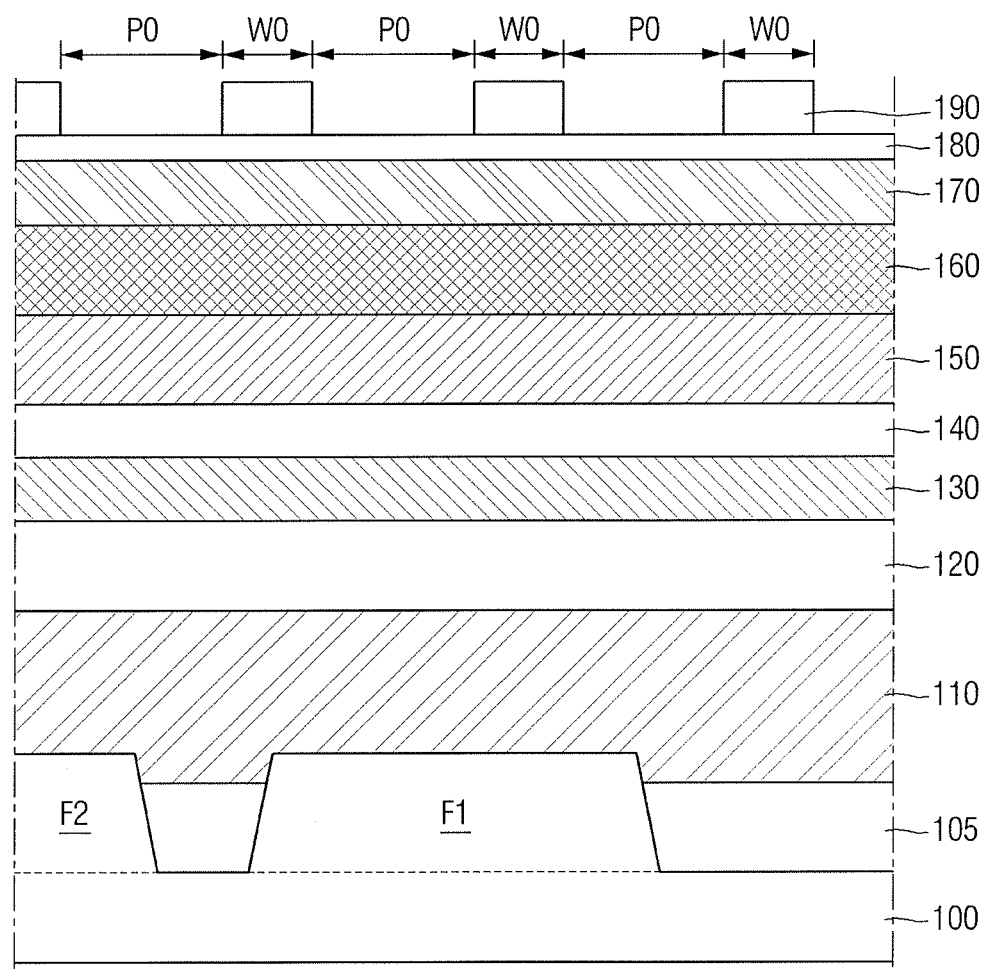

Next, referring to FIG. 13, a first photosensitive film 190 may be formed on the anti-reflection layer 180. The first photosensitive film 190 may be a photoresist (PR). The first photoresist film 190 may transfer a line type of the first photoresist film 190 shape onto underlying layers by an exposure process. The first photoresist film 190 may include a plurality of portions having a same width W0, while the portions are spaced apart from each other by a pitch P0. It is noted that "pitch" herein refers to a distance between two facing surfaces of adjacent pattern portions.

Figure 14:
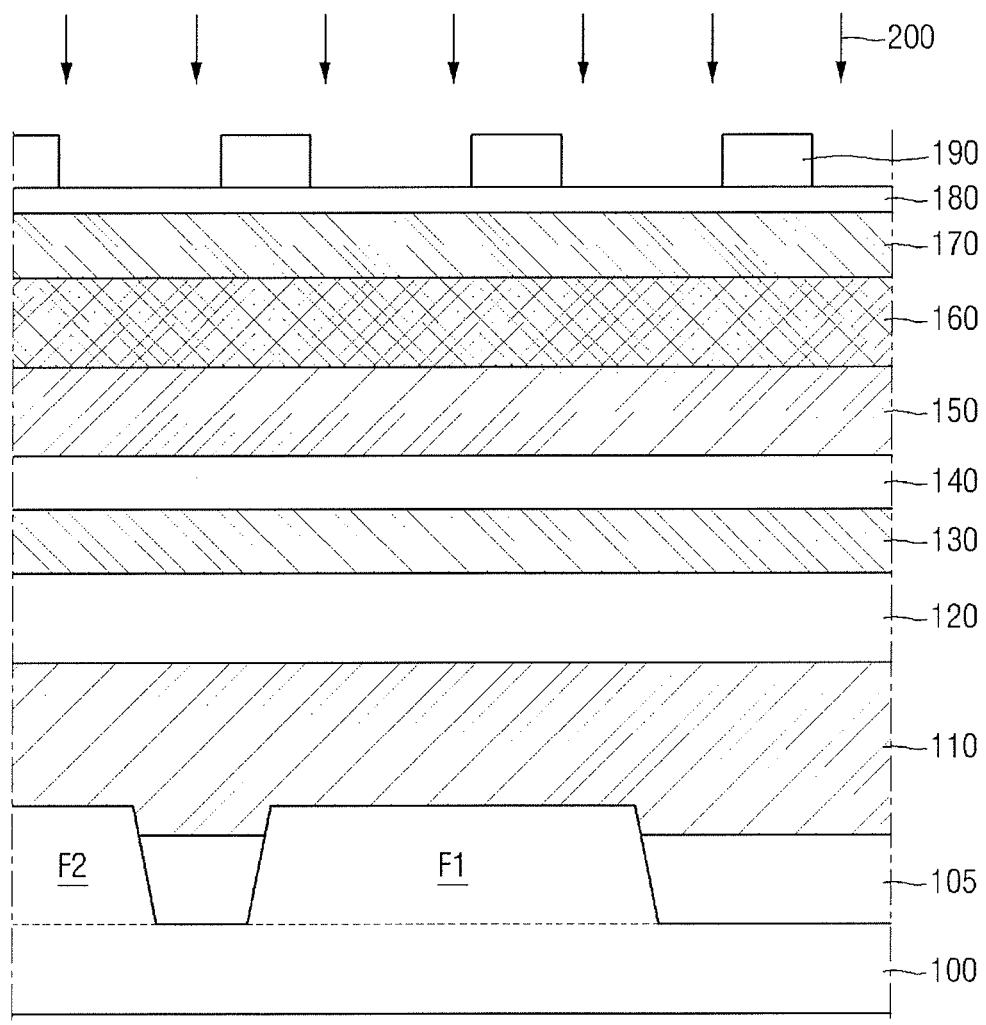

Referring to FIG. 14, a lower layer of the first mask layer 160 may be softened by an exposure process 200. That is, a portion of the lower layer covered by the first photoresist film 190 may be left, and a portion of the lower layer exposed between portions of the first photoresist film 190 may be softened by the exposure process 200.

Figure 15:
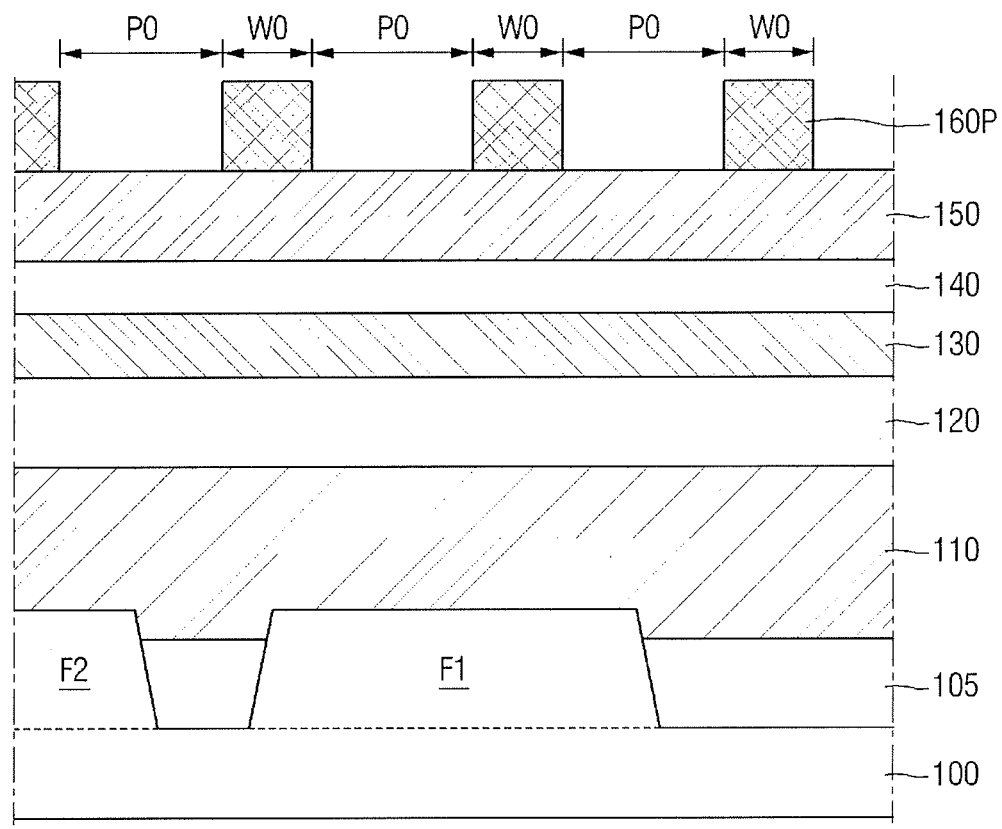

Next, referring to FIG. 15, the softened portion by the exposed process 200, e.g., including the second sacrificial capping layer 170 and the anti-reflection layer 180, may be removed to form a first mask pattern 160P. The first mask pattern 160P may have the same width W0 and pitch P0 as the first photoresist film 190. Note that the concept "same" used herein includes the possibility of having a fine stepped portion that may occur according to exposing process.

Figure 16:
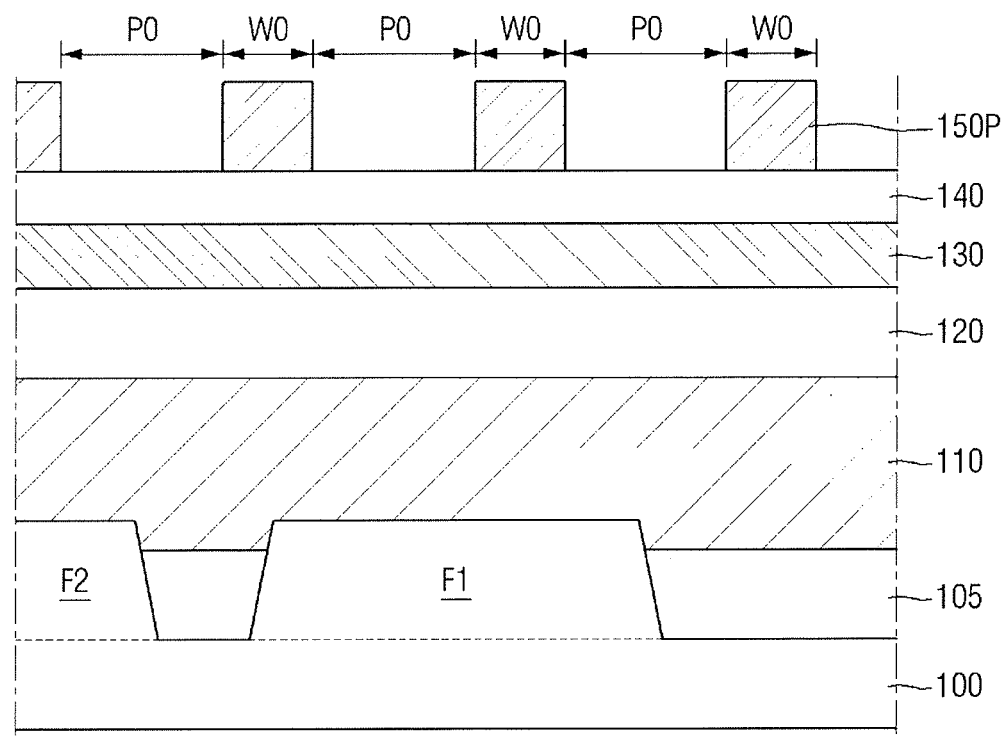

Referring to FIG. 16, the first mask pattern 160P is then transferred onto the second sacrificial pattern layer 150 to form a second sacrificial pattern 150P. The second sacrificial pattern 150P may also have the same width W0 and pitch P0 as the first photoresist film 190 and the first mask pattern 160P. Note that the concept "same" used herein includes the possibility of having a fine stepped portion that may occur according to etching process.

Figure 17:
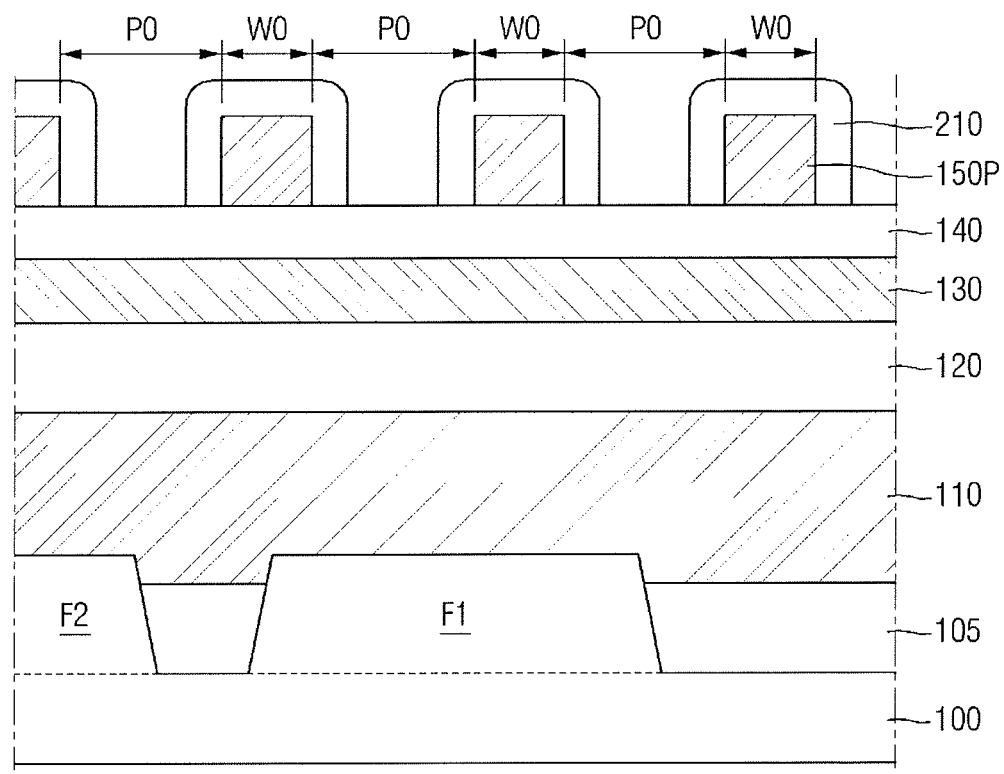

Referring to FIG. 17, a spacer film 210 covering the side surface and the upper surface of the second sacrificial pattern 150P is then formed. A material of the spacer film 210 may include a material having etch selectivity with respect to the second sacrificial pattern 150. When the second sacrificial pattern 150P is formed of any one of polycrystalline silicon, amorphous carbon layer (ACL), or spin-on hardmask (SOH), the spacer film 210 may be formed of silicon oxide or silicon nitride.

The spacer film 210 may be formed with a certain thickness. The spacer film 210 may be formed by atomic layer deposition (ALD).

Figure 18:
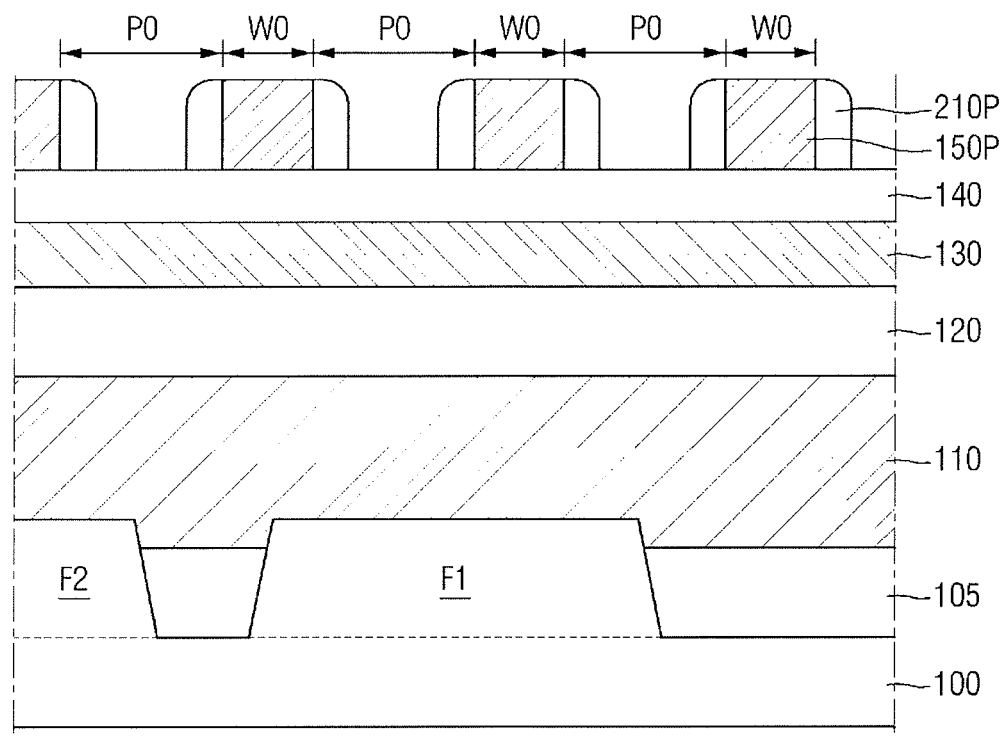

Next, referring to FIG. 18, a portion of the spacer film 210 may be removed to form a spacer pattern 210P. The spacer pattern 210P may be separately formed on both sides of the second sacrificial pattern 150P, respectively. The spacer pattern 210P may cover the side surface of the second sacrificial pattern 150P only, and expose the upper surface of the second sacrificial pattern 150P.

Figure 19:
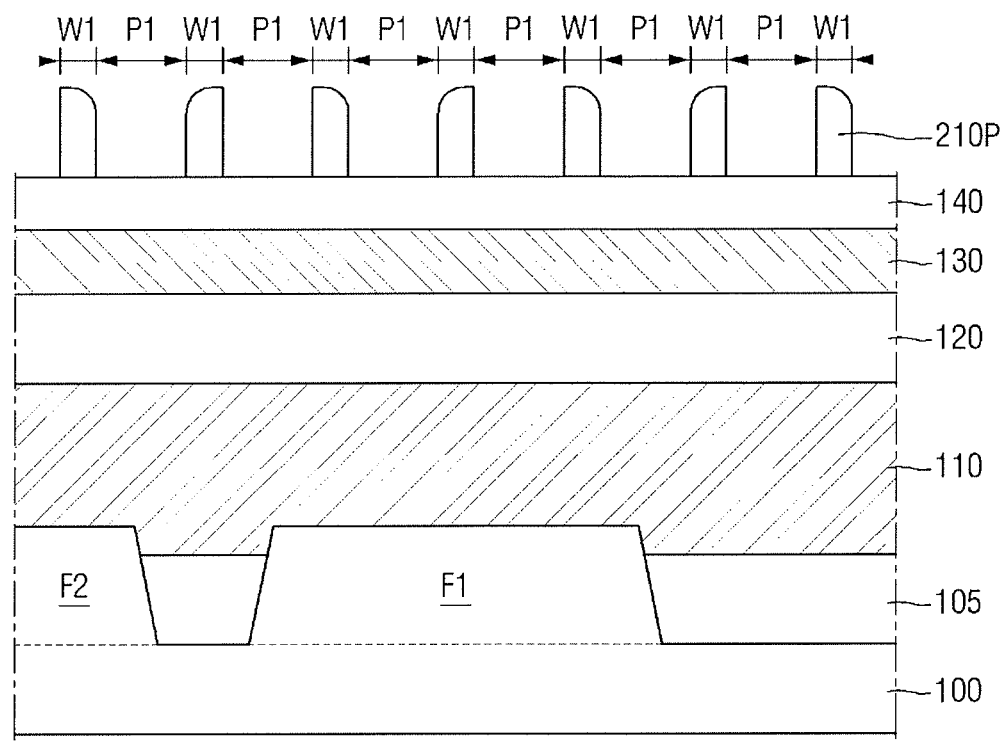

Next, referring to FIG. 19, the second sacrificial pattern 150P is removed. The spacer pattern 210P having etch selectivity with respect to the second sacrificial pattern 150P may be left, and only the second sacrificial pattern 150P may be removed. As the second sacrificial pattern 150P is removed, the spacer pattern 210P may be located at a spacing from one another.

In this case, a width of the spacer pattern 210P may all be the same width, i.e., the first width W1. Further, a pitch between the spacer patterns 210P may all be the same pitch, i.e., the first pitch P1.

Figure 20:
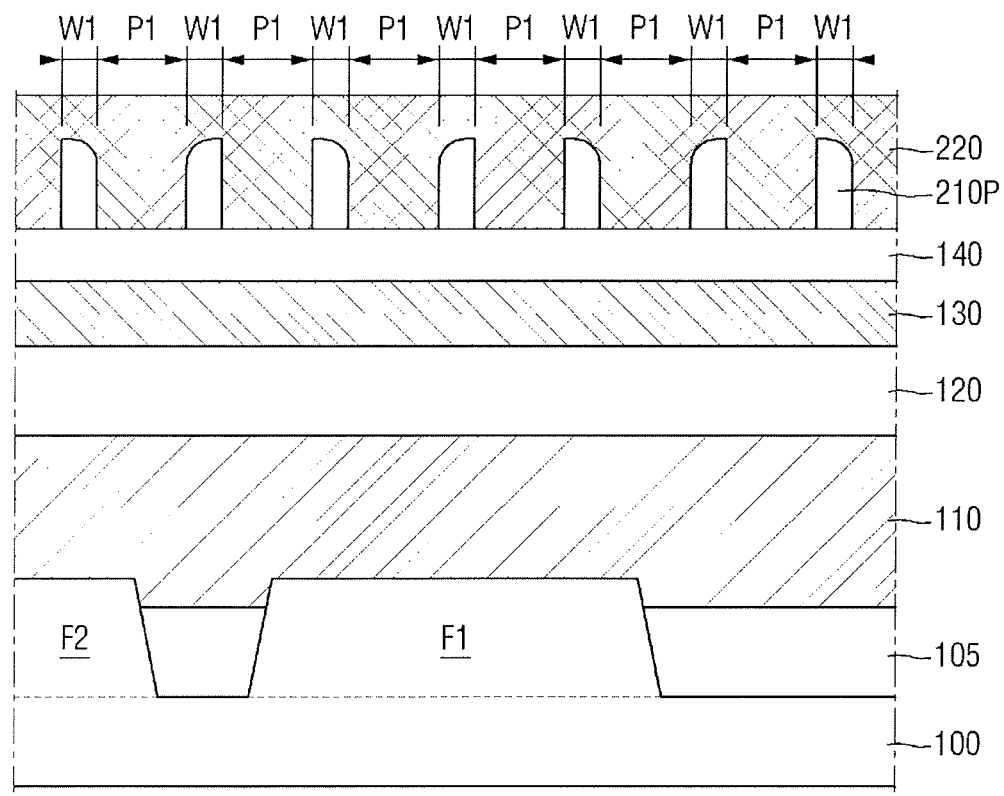

Referring to FIG. 20, a second mask layer 220 covering the upper surface of the space pattern 210P and the first sacrificial capping layer 140 is then formed. The second mask layer 220 may be formed of at least one of carbon-containing material such as amorphous carbon layer (ACL) or spin-on hardmask (SOH), or metal. The second mask layer 220 may entirely cover the spacer pattern 210P. A SiON capping layer and an anti-reflection layer may be additionally formed on the second mask layer 220.

Figure 21:
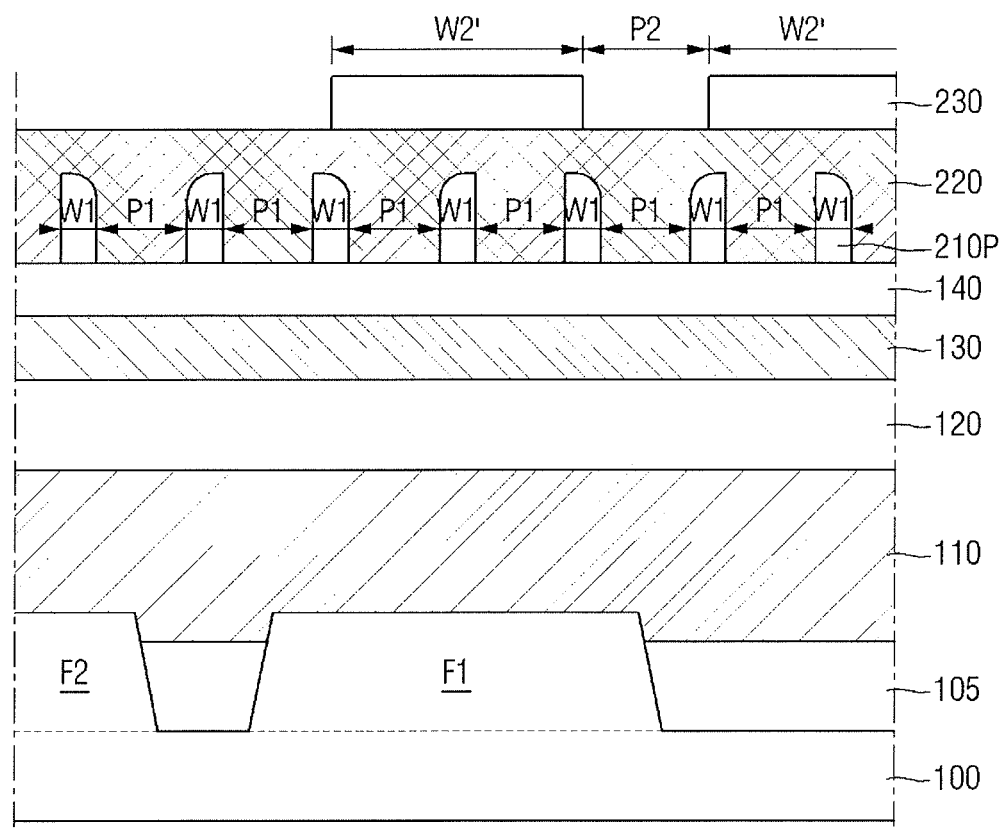

Next, referring to FIG. 21, a supporting pattern 230 is formed on the second mask layer 220. The supporting pattern 230 may be overlapped with the spacer pattern 210P. A width W2' of the supporting pattern 230 may be greater than a width W1 of the spacer pattern 210P. In detail, the width W2' of the supporting pattern 230 may be three times a width W1 of the spacer pattern 210P or greater. Accordingly, the supporting pattern 230 may be overlapped with a plurality of spacer patterns 210P in one to many basis.

A plurality of supporting patterns 230 may be provided. The supporting patterns 230 may be spaced apart from one another with the second pitch P2. The supporting patterns 230 may be a photoresist (PR). The supporting patterns 230 may transfer a line type of the supporting pattern 230 shape onto the underneath layer by an exposure process.

Figure 22:
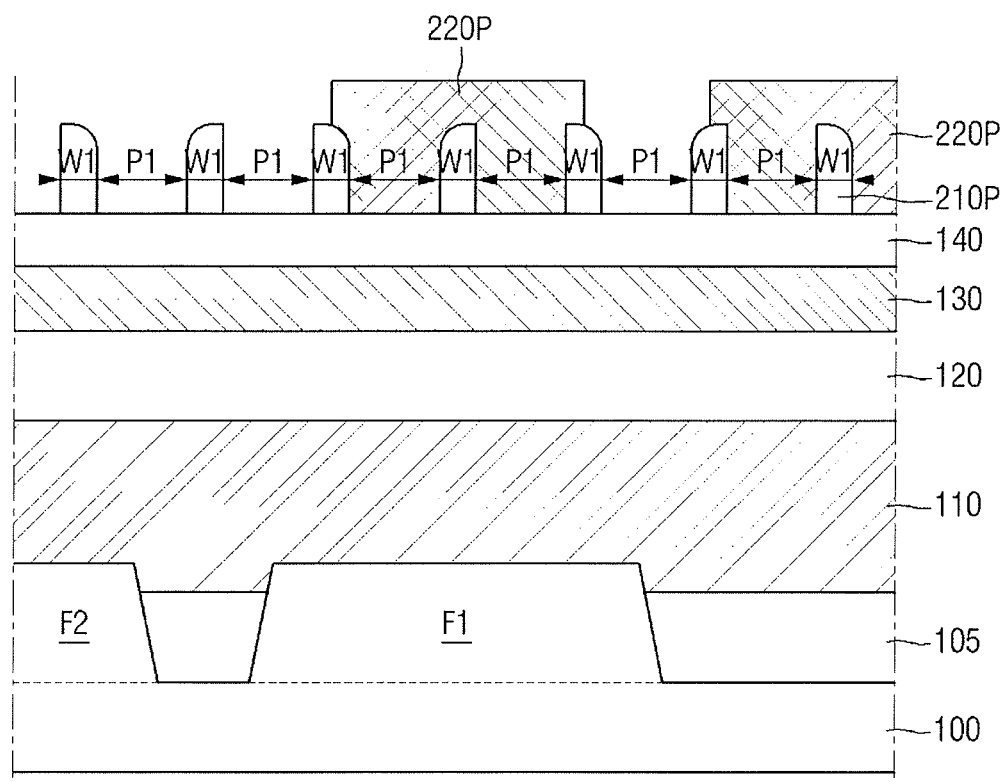

Next, referring to FIG. 22, a second mask pattern 220P is formed by patterning the second mask layer 220. The second mask pattern 220P may have the same width and pitch as the supporting pattern 230. The spacer pattern 210P within the second mask layer 220 may not be patterned. Accordingly, as illustrated, the mask pattern 220P may be formed while being overlapped with the spacer pattern 210P.

Figure 23:
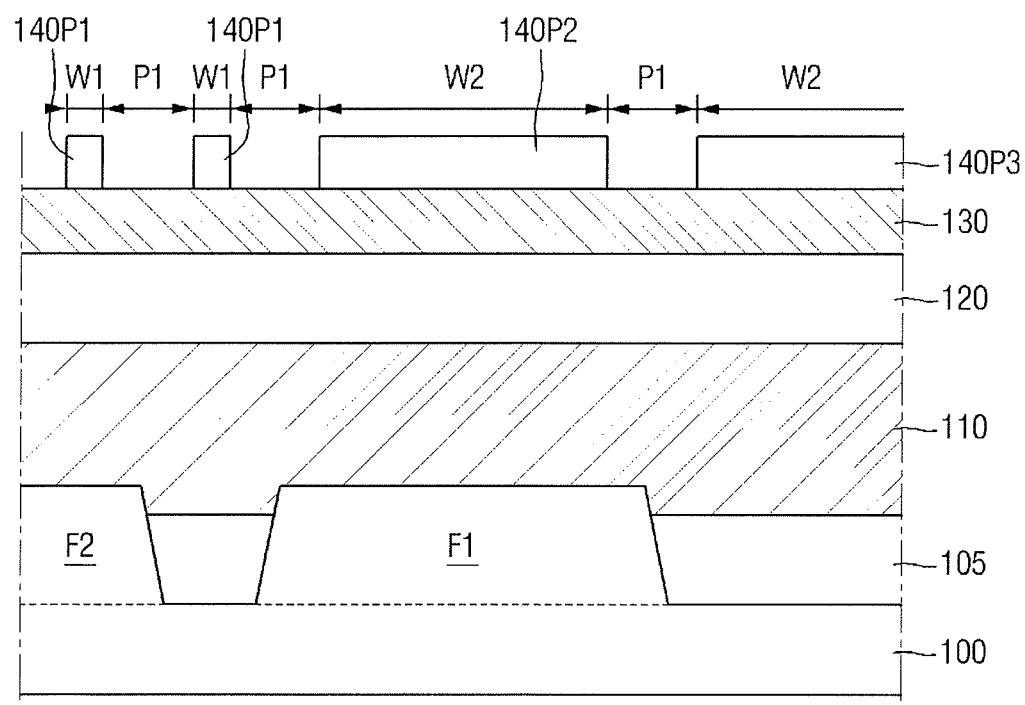

Referring to FIG. 23, the first sacrificial capping layer 140 is patterned by using the spacer pattern 210P and the second mask pattern 220P. A capping gate pattern 140P1, a first capping supporting pattern 140P2, a the second capping supporting pattern 140P3 may be formed by patterning the first sacrificial capping layer 140.

The capping gate pattern 140P1 may be formed by transferring the spacer pattern 210P that is not covered by the second mask pattern 220P. The first capping supporting pattern 140P2 and the second capping supporting pattern 140P3 may be formed by transferring a combined pattern defined by the overlapping spacer patterns 210P and second mask pattern 220P. Accordingly, the first capping supporting pattern 140P2 and the second capping supporting pattern 140P3 may have the second width W2, e.g., the second width W2 equals a sum of the width W2' of the second mask pattern 220P and portions of the spacer patterns 210 overlapped by the second mask pattern 220P and extending beyond the second mask pattern 220P. Further, the capping gate pattern 140P1, the first capping supporting pattern 140P2, and the second capping supporting pattern 140P3 may be spaced apart from one another by the first pitch P1.

Figure 24:
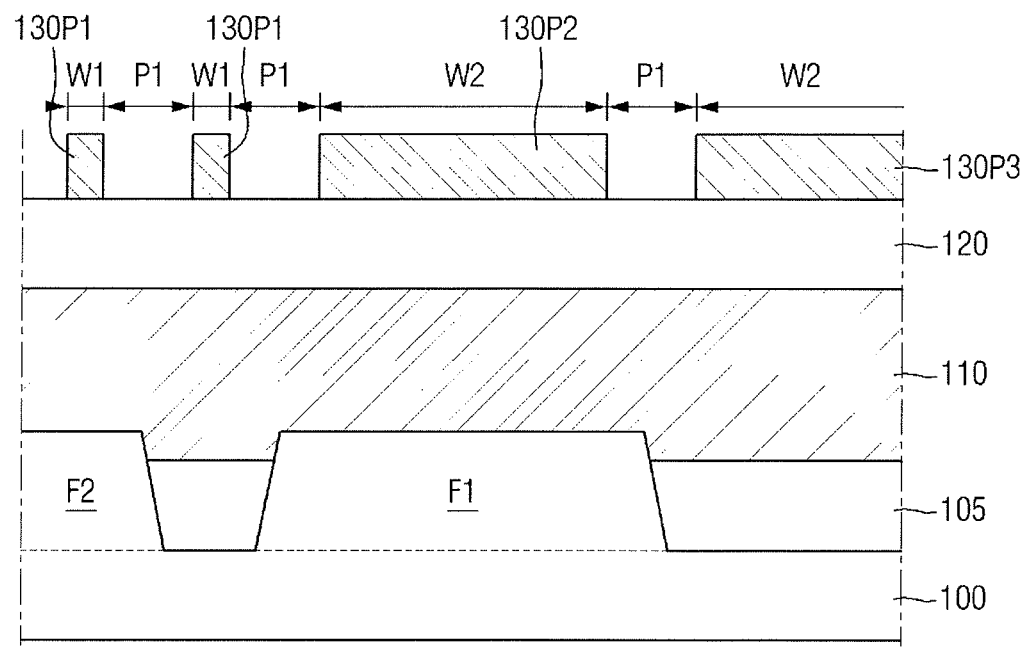

Next, referring to FIG. 24, a sacrificial gate pattern 130P1, a first sacrificial supporting pattern 130P2, and a second sacrificial supporting pattern 130P3 are formed by patterning the first sacrificial pattern layer 130 with the capping gate pattern 140P1, the first capping supporting pattern 140P2, and the second capping supporting pattern 140P3, respectively. The sacrificial gate pattern 130P1, the first sacrificial gate pattern 130P2, and the second sacrificial supporting pattern 130P3 may have the same width and pitch as the capping gate pattern 140P1, the first capping supporting pattern 140P2, and the second capping supporting pattern 140P3, respectively.

Figure 25:
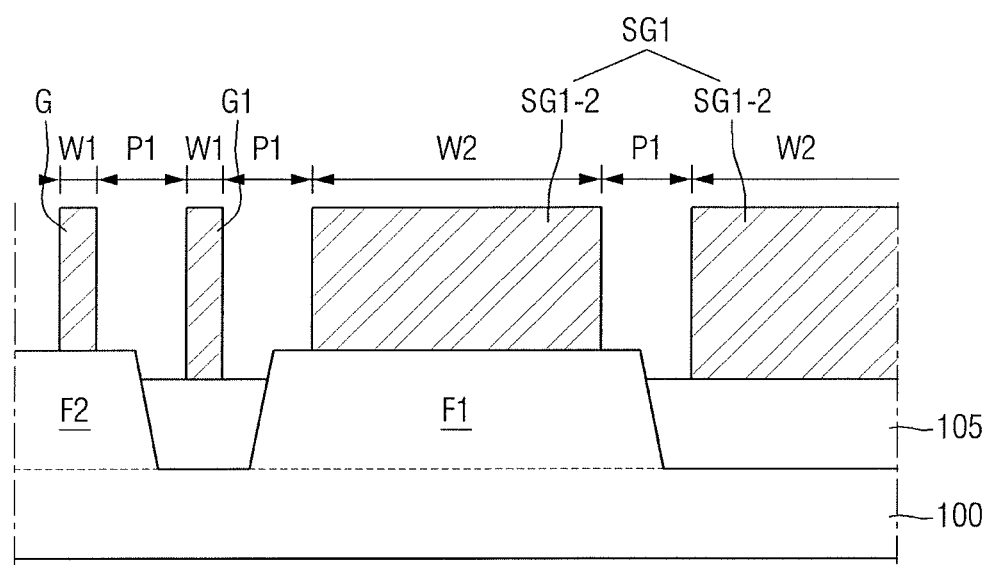

Then, referring to FIG. 25, the gate G, the first outermost gate G1, and the supporting gates SG1 and SG2 are formed by transferring the sacrificial gate pattern 130P1, the first sacrificial supporting pattern 130P2, and the second sacrificial supporting patter 130P3 onto the gate layer 110. Next, referring to FIG. 3. the first spacer SP1 and the second spacer SP2 are formed on the side surfaces of the gate G, the first outermost gate G1, and the supporting gates SG1 and SG2. Further, after forming the interlayer insulating film 198 on the gate G, the first outermost gate G1. and the supporting gates SG1 and SG2, the gate contact 199 may be formed so as to be in contact with the gate G used as an active gate. According to some exemplary embodiments, the work function metal MG1 and the fill metal MG2 may be formed by a replacement process, as illustrated in FIG. 5.

In the method for fabricating a semiconductor device according to some exemplary embodiments, the supporting pattern 230 may be formed so as to be overlapped with the spacer patterns 210P, such that the supporting gates SG1 and SG2 by the supporting pattern 230 may be formed so as to be overlapped with the gate G by the spacer pattern 210P. That is, the supporting pattern 230 may be formed to overlap a plurality of spacer patterns 210P in order to form a single mask pattern 220P defining the supporting gates SG1 and SG2. As such, the resultant supporting gates SG1 and SG2 may help the gate region GR, which includes a plurality of active gates G spaced apart at a certain pitch, to be free from interference with other regions, and may be formed so as to prevent defects at the outermost patterns in the etch process.

In addition, a dummy gate may be required at an outer side of a plurality of gates G to ensure uniformity in the exposure process. That is, the exposure process may be such that the density of the nearby patterns applies as a major factor. In other words, depending on whether there is a similar pattern nearby or not, the critical dimension (CD) of the exposed pattern may vary. Accordingly, to ensure uniformity of such CD, an additional pattern, e.g., a dummy gate, may be formed on the side surface of the actually-used pattern, e.g., adjacent to an outermost active gate.

However, as a semiconductor device according to some exemplary embodiments is formed by overlapping the supporting pattern 230 with a plurality of spacer patterns 210P, e.g., merging mask patterns for forming dummy gates for uniformity purpose with mask patterns for forming supporting gates for preventing damage to outer patterns, additional space for the supporting gates SG1 and SG2 may not be needed. That is, the resultant supporting gates SG1 and SG2 may prevent damage of outermost gate pattern and secure critical dimension uniformity (CDU) during a lithography process in a smaller area.

Therefore, it is possible to efficiently save at least a space where the supporting gates SG1 and SG2 are formed. Furthermore, this also allows to improve the integration density of the entire semiconductor device. An enhancement of integration density may refer to an enhancement of speed, capacity, and performance of the semiconductor device. Therefore, a method for fabricating a semiconductor device according to some exemplary embodiments overlaps the supporting pattern 230 with the spacer pattern 210P and thus can improve the performance of the semiconductor device.

Hereinbelow, a method for fabricating a semiconductor device according to some exemplary embodiments will be described with reference to FIGS. 9, and 22 to 34.

FIGS. 26 to 34 are cross-sectional views illustrating intermediate stages in a method for fabricating a semiconductor device according to some exemplary embodiments.

Figure 26:
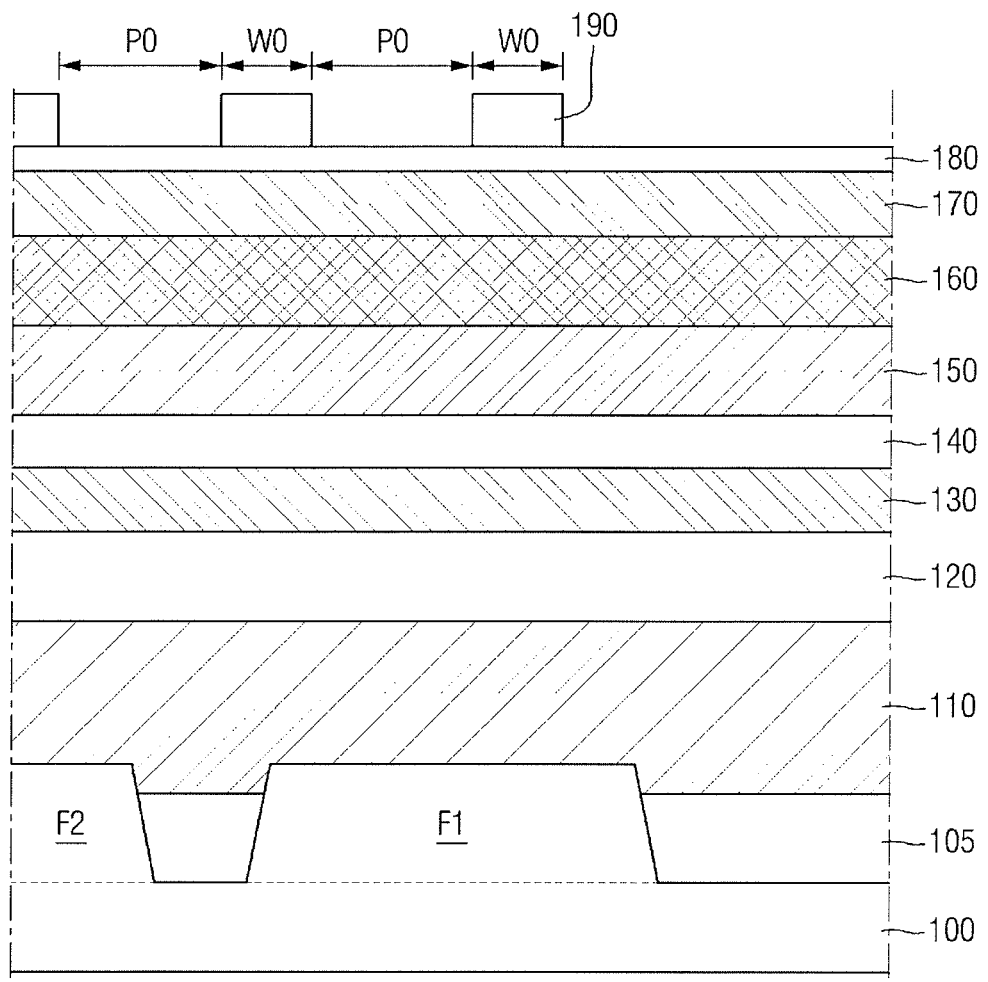
FIGS. 26 to 34 illustrate views of intermediate stages in a method for fabricating a semiconductor device according to some exemplary embodiments.

Referring to FIG. 26, several layers may be formed by stacking on the substrate 100, and the first photoresist film 190 may be formed on the anti-reflection layer 180.

To explain it sequentially, the fins F1 and F2 may be formed on the substrate 100, and the field insulating film 105 may be formed between the fins F1 and F2. Next, a gate layer 110, a capping layer 120, a first sacrificial pattern layer 130, and a first sacrificial capping layer 140, a second sacrificial pattern layer 150, a first mask layer 160, a second sacrificial capping layer 170, and an anti-reflection layer 180 may be formed sequentially on the fins F1 and F2 and the field insulating film 105.

The first photosensitive film 190 may be a photoresist (PR). The first photoresist film 190 may transfer a line type of the first photoresist film 190 shape onto the lower portion by an exposure process. The first photoresist film 190 may all have the same width W0, and may all be spaced apart with the same pitch P0.

Figure 27:
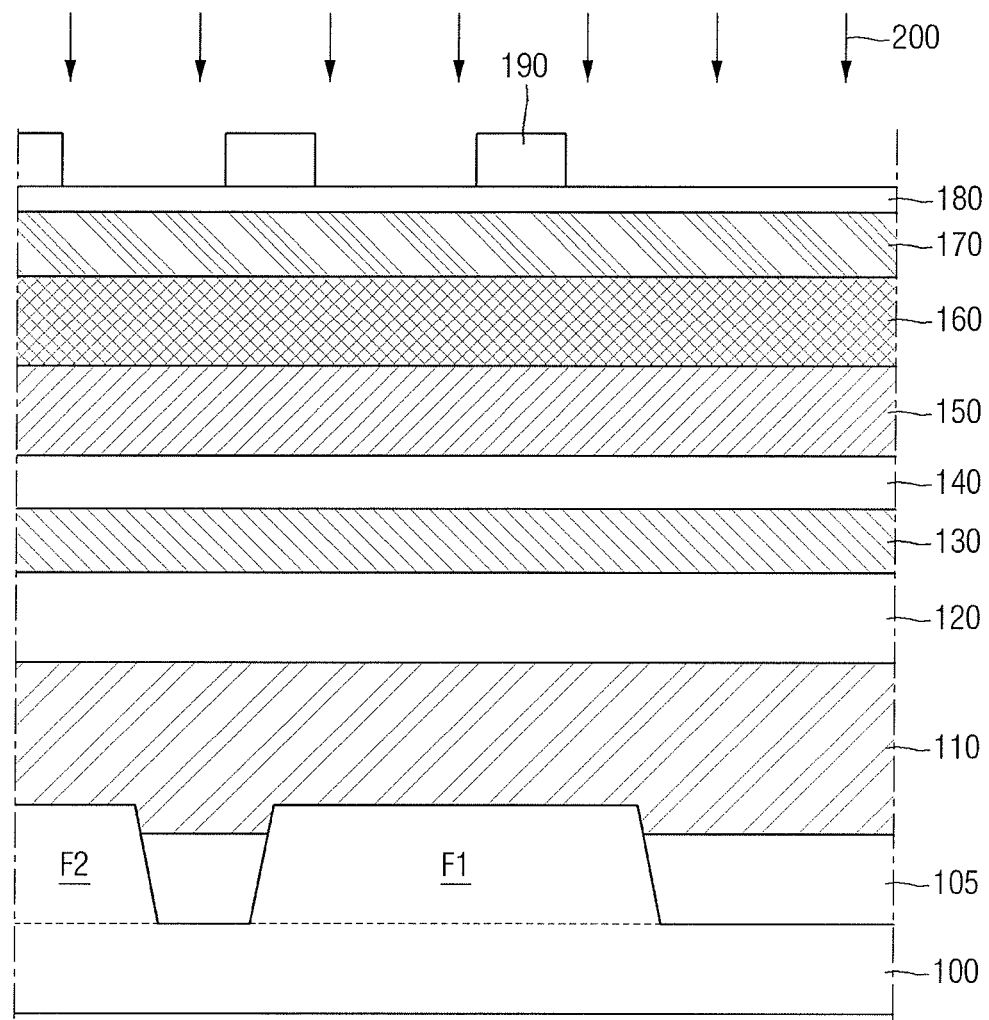

Referring to FIG. 27, the lower layer may then be softened by the exposure process 200. The portion covered by the first photoresist film 190 may be left, and the rest exposed portion may be softened by the exposure process 200.

Figure 28:
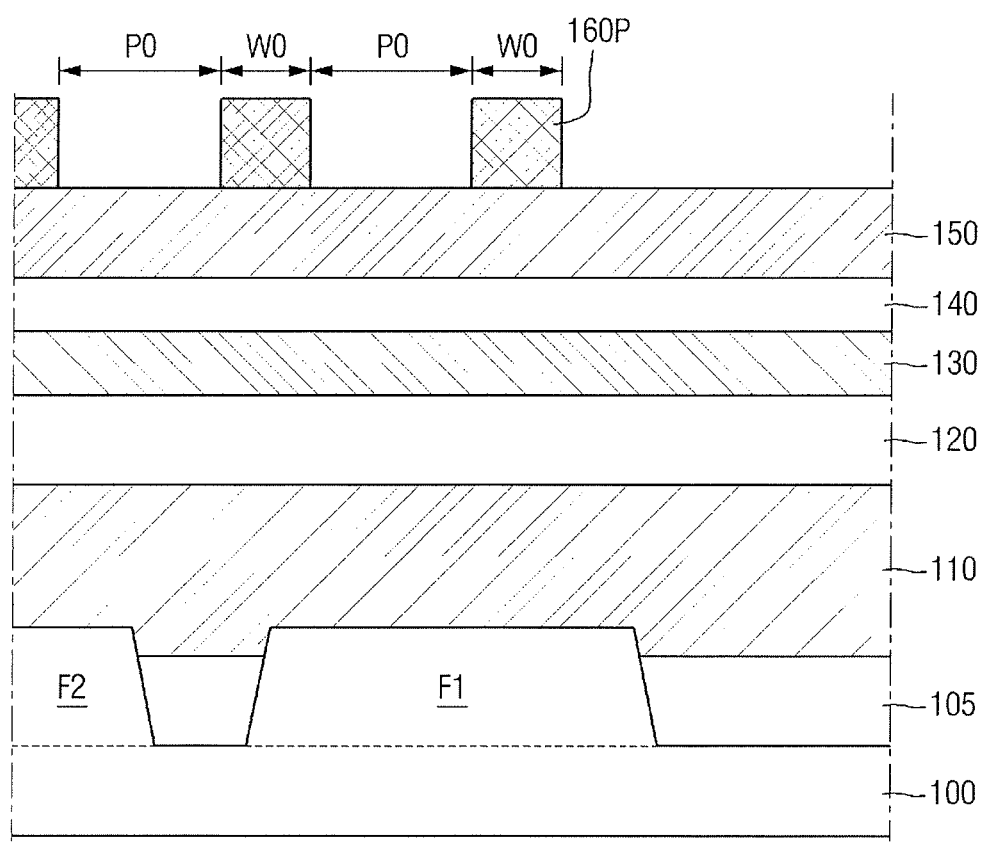

Next, referring to FIG. 28, the portion softened by the exposed process 200 may be removed to form a first mask pattern 160P. The first mask pattern 160P may have the same width W0 and pitch P0 as the first photoresist film 190. Note that the concept "same" used herein includes the possibility of having a fine stepped portion that may occur according to exposing process.

Figure 29:
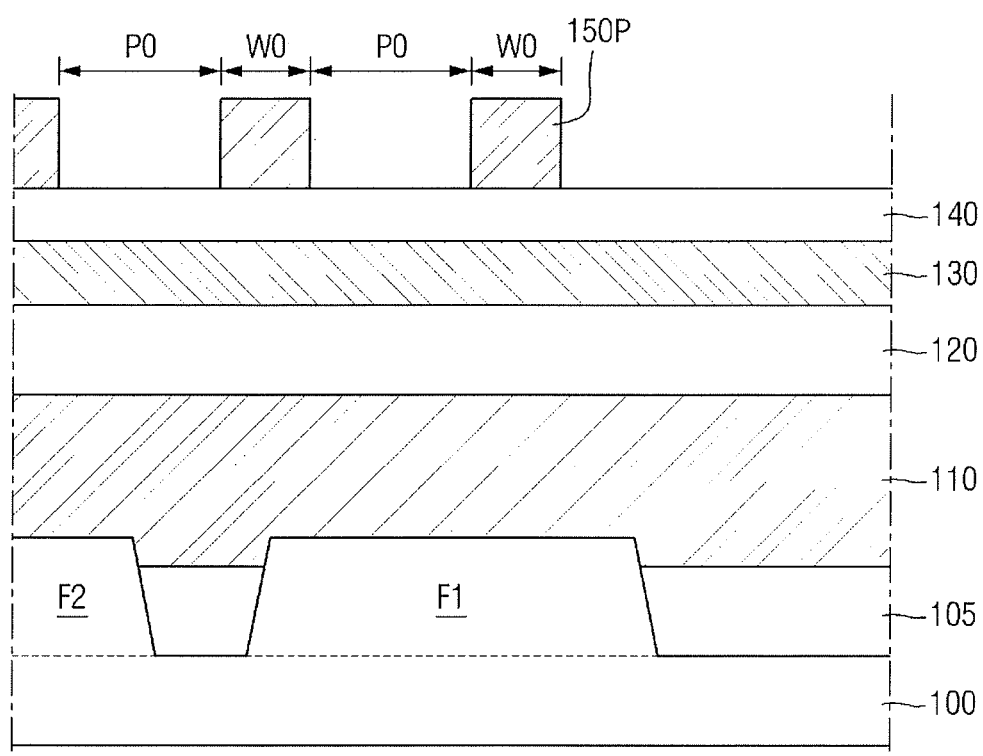

Referring to FIG. 29, the first mask pattern 160P is then transferred onto the second sacrificial pattern layer 150 to form the second sacrificial pattern 150P. The second sacrificial pattern 150P may also have the same width W0 and pitch P0 as the first photoresist film 190 and the first mask pattern 160P. Note that the concept "same" as used herein includes the possibility of having a fine stepped portion that may occur according to etching process.

Figure 30:
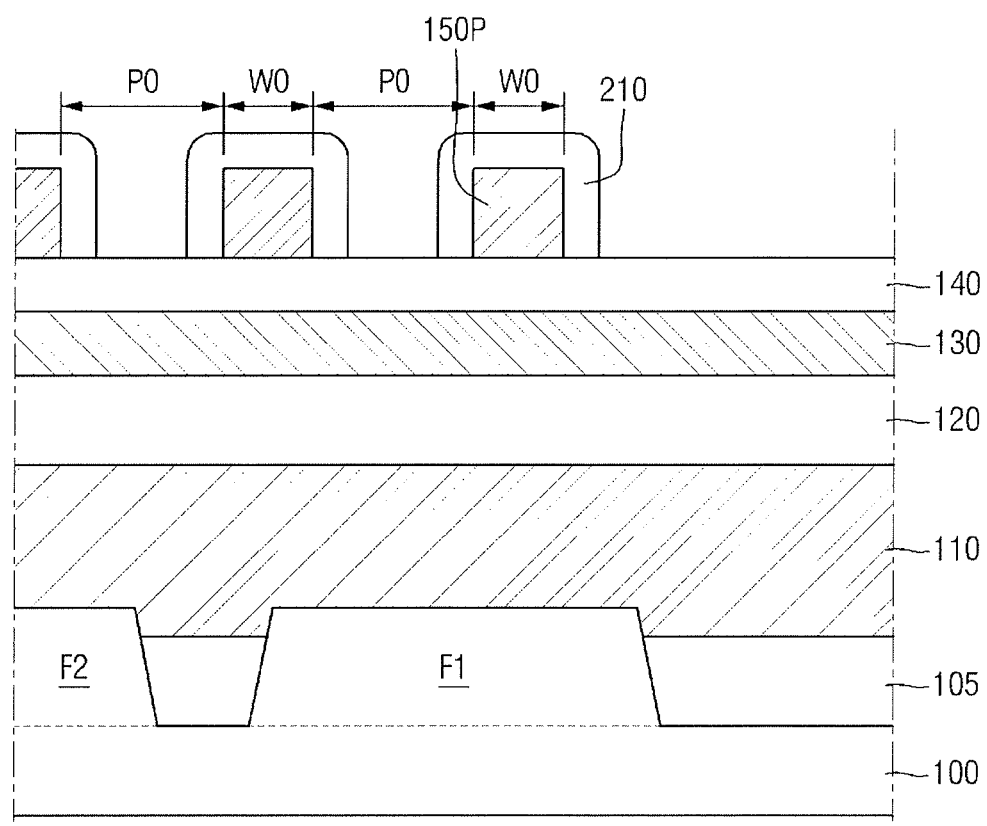

Referring to FIG. 30, the spacer film 210 covering the side surface and the upper surface of the second sacrificial pattern 150P is then formed. A material of the spacer film 210 may include a material having etch selectivity to the second sacrificial pattern 150. When the second sacrificial pattern 150P is formed of any one of polycrystalline silicon, amorphous carbon layer (ACL), or spin-on hardmask (SOH), the spacer film 210 may be formed of silicon oxide or silicon nitride. The spacer film 210 may be formed with a certain thickness. The spacer film 210 may be formed by atomic layer deposition (ALD).

Figure 31:
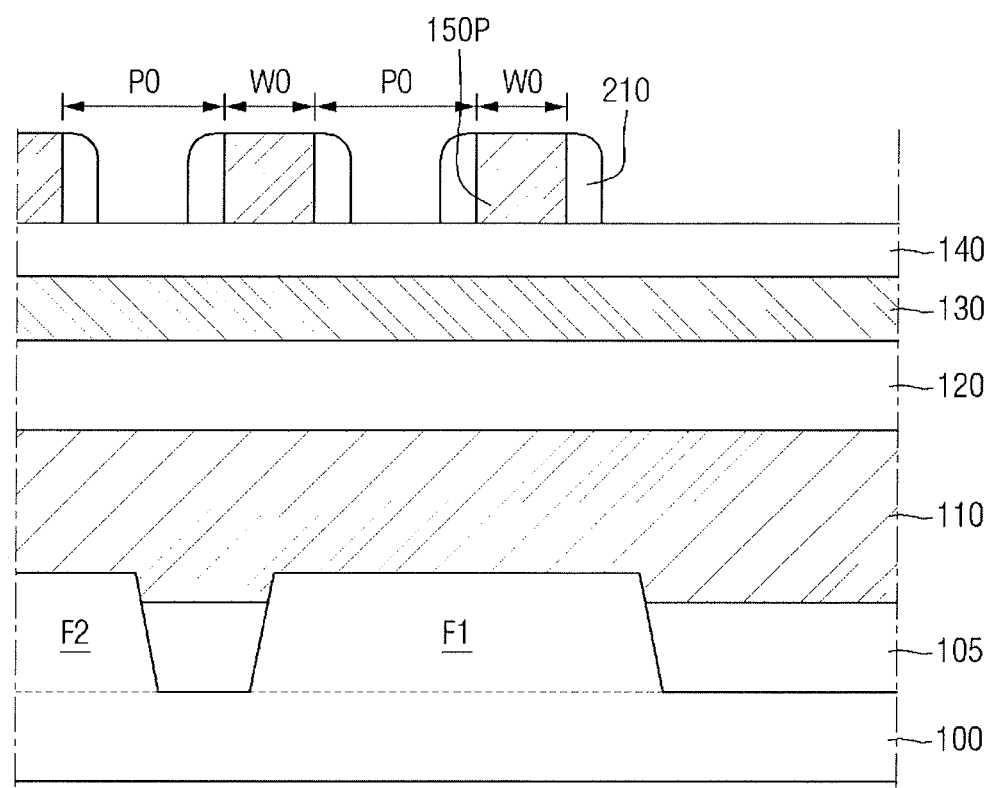

Next, referring to FIG. 31, a portion of the spacer film 210 may be removed to form a spacer film pattern 210P. The spacer pattern 210P may be separately formed on both sides of the second sacrificial pattern 150P, respectively. The spacer pattern 210P may cover only the side surface of the second sacrificial pattern 150P, and expose the upper surface of the second sacrificial pattern 150P.

Figure 32:
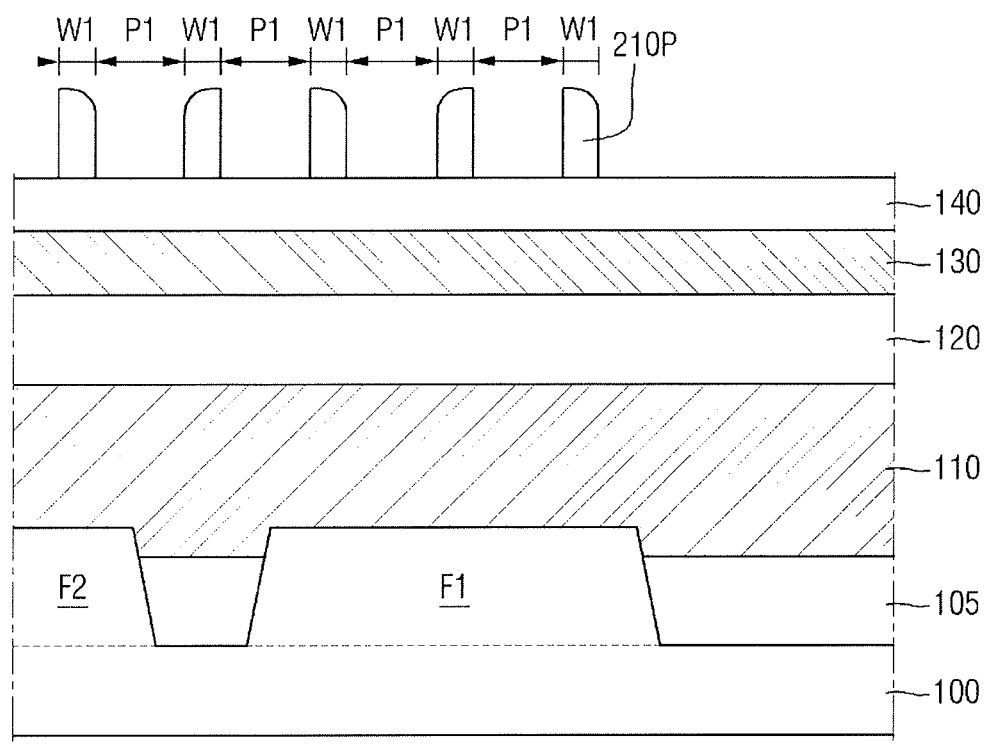

Next, referring to FIG. 32, the second sacrificial pattern 150P is removed. The spacer pattern 210P having etch selectivity to the second sacrificial pattern 150P may be left, and only the second sacrificial pattern 150P may be removed. As the second sacrificial pattern 150P is removed, the spacer pattern 210P may be located at a spacing apart from one another.

In this case, widths of the spacer pattern 210P may all be same, i.e., the first width W1. Further, pitches between the spacer patterns 210P may all be same, i.e., the first pitch P1.

Figure 33:
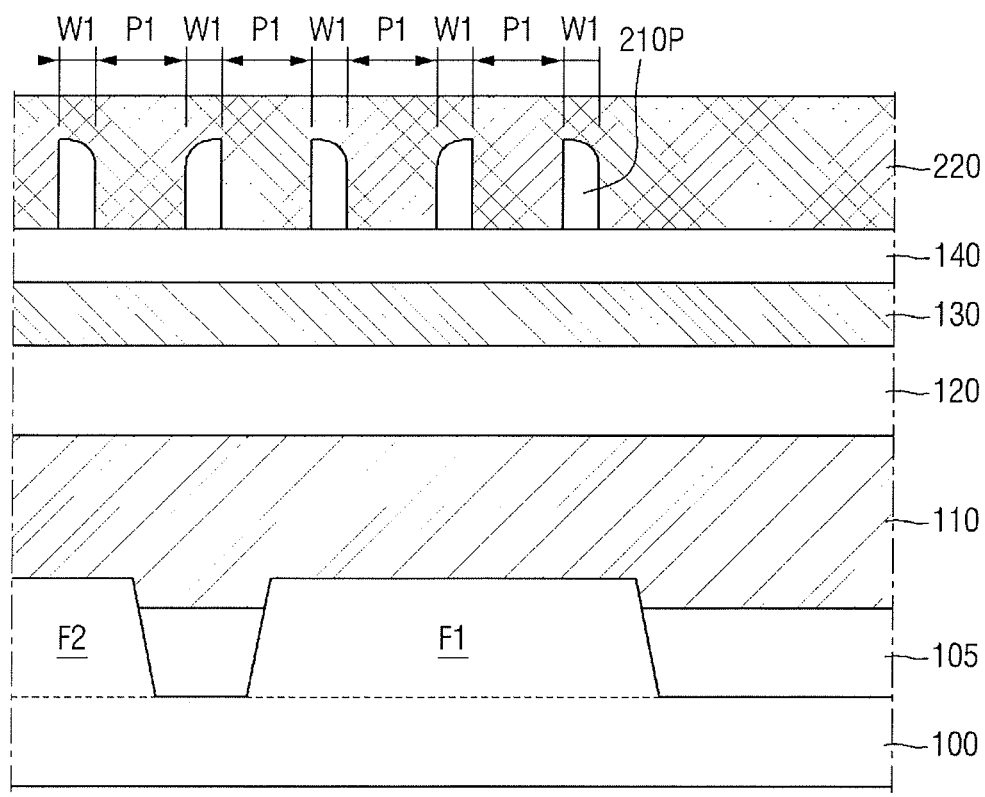

Referring to FIG. 33, the second mask layer 220 covering the upper surface of the space pattern 210P and the first sacrificial capping layer 140 is then formed. The second mask layer 220 may be formed of at least one of carbon-containing material such as amorphous carbon layer (ACL) or spin-on hardmask (SOH), or metal. The second mask layer 220 may entirely cover the spacer pattern 210P. A SiON capping layer and an anti-reflection layer may be additionally formed on the second mask layer 220.

Figure 34:
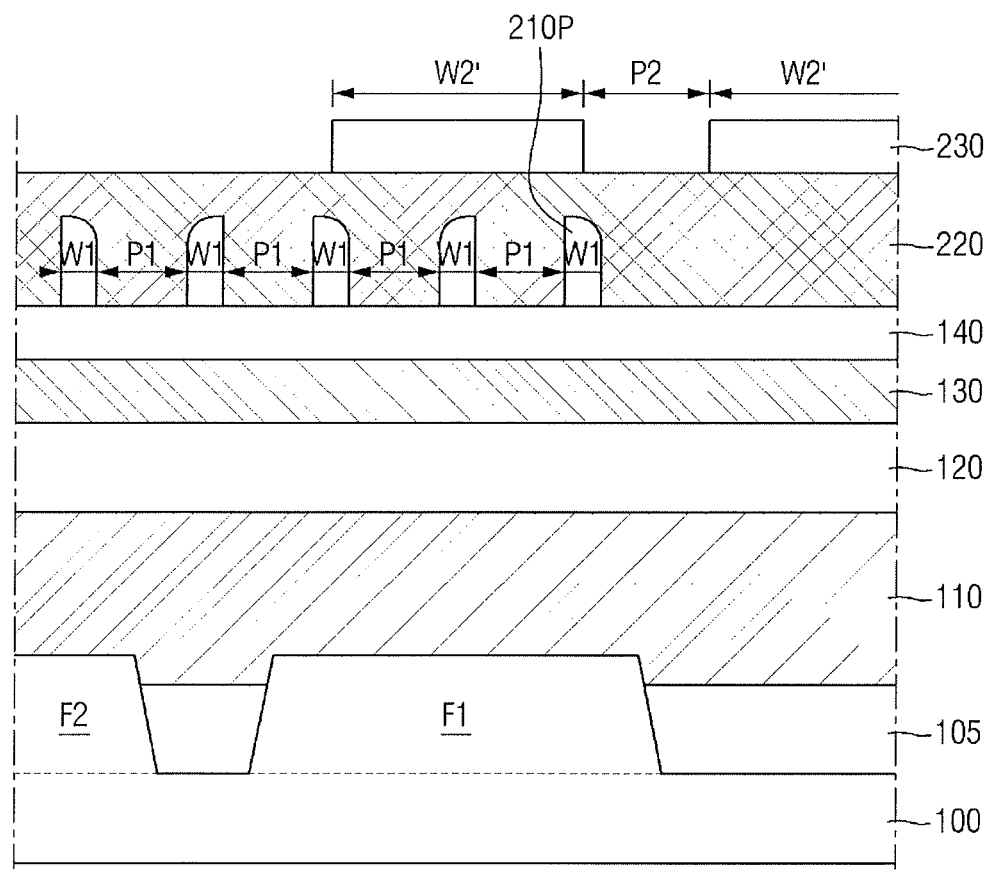

Next, referring to FIG. 34, a supporting pattern 230 is formed on the second mask layer 220. The supporting pattern 230 may be overlapped with the spacer pattern 210P. A width W2' of the supporting pattern 230 may be greater than a width W1 of the spacer pattern 210P. Accordingly, the supporting pattern 230 may be overlapped with a plurality of spacer patterns 210P in one to many basis.

A plurality of supporting patterns 230 may be provided. The supporting patterns 230 may be spaced apart from one another with the second pitch P2. The supporting patterns 230 may be a photoresist (PR). The supporting patterns 230 may transfer a line type of the supporting pattern 230 shape onto the lower layer by an exposure process.

At this time, some of a plurality of supporting patterns 230 may be overlapped with the spacer pattern 210P, and the rest may not be overlapped with the spacer pattern 210P. At this time, the outermost spacer pattern located outermost side of the spacer patterns may be overlapped. Since some of a plurality of supporting patterns 230 are overlapped with the spacer pattern 210P and the rest is not overlapped with the spacer pattern 210P, for the non-overlapped portion, an original width W2' of the supporting pattern 230 may be transferred onto the underneath layer by the subsequent transfer process.

The following process may be the same as those described above in FIGS. 22 to 25 except for the width of the supporting pattern 230.

Next, referring to FIG. 9, because only some of the supporting patterns 230 are overlapped, the first outer supporting gate SG1-2, having a third width W3 different from the second width W2 of the first inner supporting gate SG1-1 by overlapped supporting pattern 230, may be formed.

Hereinbelow, a method for fabricating a semiconductor device according to some exemplary embodiments will be explained with reference to FIGS. 9, 22 to 33, and 35.

Figure 35:
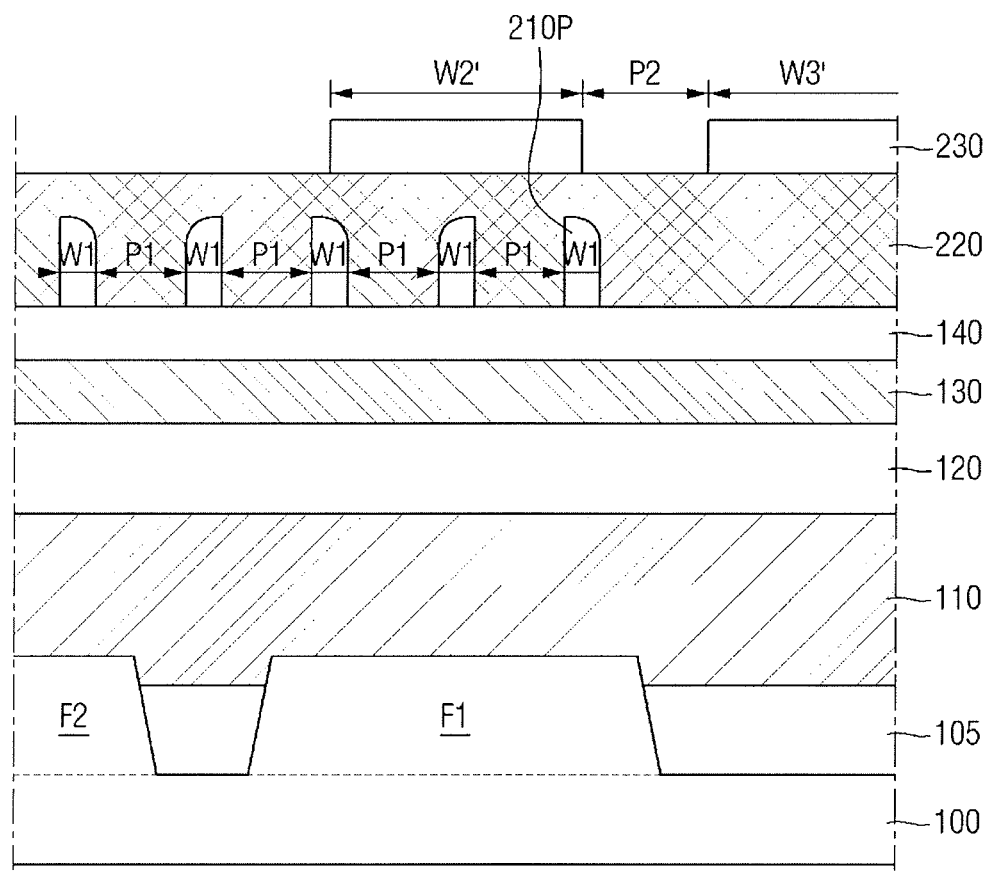
FIG. 35 illustrates a view of an intermediate stage in a method for fabricating a semiconductor device according to some exemplary embodiments.

FIG. 35 is a view illustrating an intermediate stage in a method for fabricating a semiconductor device according to some exemplary embodiments.

First, description of FIGS. 26 to 33 is the same as the description provided above. Next, referring to FIG. 35, a supporting pattern 230 is formed on the second mask layer 220.

A plurality of supporting patterns 230 may be provided. Some of a plurality of supporting patterns 230 may be overlapped with the spacer pattern 210P. A width W2' of the supporting pattern 230 overlapped with the spacer pattern 210P may be greater than a width W1 of the spacer pattern 210P. Accordingly, the supporting pattern 230 overlapped with the spacer pattern 210P may be overlapped with a plurality of spacer patterns 210P in one to many basis.

A plurality of supporting patterns 230 may be spaced apart from one another with the second pitch P2. The supporting patterns 230 may be photoresists (PR). The supporting patterns 230 may transfer a line type of the supporting pattern 230 shape onto the underneath layer by an exposure process.

The supporting pattern 230 that is not overlapped with the spacer pattern 210P may have a width W3' that is different from a width W2' of the supporting pattern 230 overlapped therewith. As a result, for the non-overlapped portion, the width W3' that is different from the width W2' of the supporting pattern 230 overlapped with the spacer pattern 210P may be transferred onto the underneath layer in the subsequent transfer process. The following process may be the same as those described above described in FIGS. 22 to 25 except for the width of the supporting pattern 230.

Next, referring to FIG. 9, because only some of the supporting patterns 230 are overlapped, the first outer supporting gate SG1-2 having a third width W3 that is different from the second width W2 of the first inner supporting gate SG1-1 by overlapped supporting pattern 230 may be formed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a semiconductor device, the method comprising:
   forming, on a substrate, a semiconductor layer, a first sacrificial layer, and a second sacrificial layer, sequentially;
   patterning the second sacrificial layer to form a second sacrificial pattern;
   forming a spacer pattern on opposite sides of the second sacrificial pattern respectively, wherein a pitch of the spacer pattern is a constant pitch, and a width of the spacer pattern is a constant width;
removing the second sacrificial pattern;
forming a mask layer that covers the spacer pattern;
forming a supporting pattern on the mask layer, wherein a width of the supporting pattern is greater than a width of the spacer pattern, and the supporting pattern is overlapped with at least a portion of the spacer pattern;
transferring the supporting pattern and the spacer pattern onto the first sacrificial layer to form sacrificial gate patterns and a sacrificial supporting pattern; and
transferring the sacrificial gate patterns and the sacrificial supporting pattern onto the semiconductor layer to form gates and a supporting gate,
wherein a pitch between adjacent gates equals a pitch between the supporting gate and a most adjacent gate, and equals the constant pitch of the spacer pattern.

2. The method as claimed in claim 1, wherein the spacer pattern includes an oxide film.

3. The method as claimed in claim 1, wherein the sacrificial supporting pattern includes first and second sacrificial supporting patterns, and the first sacrificial supporting pattern is formed between the second sacrificial supporting pattern and the sacrificial gate patterns.

4. The method as claimed in claim 3, wherein a width of the first sacrificial supporting pattern is different from a width of the second sacrificial supporting pattern.

5. The method as claimed in claim 3, wherein a pitch between the first sacrificial supporting pattern and the second sacrificial supporting pattern is different from a pitch of the spacer pattern.

6. The method as claimed in claim 5, wherein a pitch between the first sacrificial supporting pattern and the second sacrificial supporting pattern is greater than the pitch of the spacer pattern.

7. The method as claimed in claim 5, wherein:
transferring the sacrificial supporting pattern onto the semiconductor layer includes transferring the first and second sacrificial supporting patterns onto the semiconductor layer to form first and second supporting gates, and
a pitch between the first and second supporting gates equals the pitch between adjacent gates.

8. The method as claimed in claim 1, wherein the gates and the supporting gate extend in parallel in a first direction.

9. The method as claimed in claim 8, further comprising a fin-type pattern protruded further than the substrate, extended in a second direction intersecting with the first direction, and formed under the gates and the supporting gate.

10. The method as claimed in claim 9, wherein the fin-type pattern is plural, and the semiconductor device further comprises a field insulating film formed between the fin-type patterns.

11. A method for fabricating a semiconductor device, the method comprising:
forming, on a substrate, a semiconductor layer, a first sacrificial layer, a second sacrificial layer, and a first mask layer, sequentially;
patterning the first mask layer using exposure to form a first mask pattern;
transferring the first mask pattern onto the second sacrificial layer to form a second sacrificial pattern;
forming a spacer pattern on opposite sides of the second sacrificial pattern;
forming a second mask layer that covers the spacer pattern;
forming a supporting pattern on the second mask layer, wherein the supporting pattern is overlapped with the spacer pattern;
patterning the second mask layer using exposure to form a second mask pattern;
transferring the second mask pattern and the spacer pattern onto the first sacrificial layer to form sacrificial gate patterns and a sacrificial supporting pattern; and
transferring the sacrificial gate patterns and the sacrificial supporting pattern onto the semiconductor layer to form gates and a supporting gate, such that a pitch between adjacent gates equals a pitch between the supporting gate and a most adjacent gate, and equals a constant pitch of the spacer pattern.

12. The method as claimed in claim 11, wherein the semiconductor layer includes a gate layer and a capping layer on the gate layer.

13. The method as claimed in claim 12, wherein the gate layer includes polysilicon, and the capping layer includes SiN.

14. The method as claimed in claim 11, wherein forming the first sacrificial layer includes forming a first sacrificial pattern layer, and forming a first sacrificial capping layer on the first sacrificial pattern layer.

15. The method as claimed in claim 14, wherein forming the sacrificial gate patterns and the sacrificial supporting pattern includes:
patterning the first sacrificial capping layer to form a capping gate pattern and a capping supporting pattern; and
patterning the first sacrificial pattern layer using the capping gate pattern and the capping supporting pattern.

16. The method as claimed in claim 11, wherein:
the spacer pattern includes a plurality of spacer patterns at the constant pitch, an outermost spacer pattern of the plurality of spacer patterns being located in an outermost side of the plurality of spacer patterns, and the supporting pattern being overlapped with the outermost spacer pattern.

17. The method as claimed in claim 11, wherein a width of the supporting pattern is greater than a width of the spacer patterns, and the supporting pattern is overlapped with a plurality of spacer patterns.

18. The method as claimed in claim 11, wherein a width of the second mask pattern is greater than or equal to a width of the supporting pattern.

19. A method for fabricating a semiconductor device, the method comprising:
forming, on a substrate, a semiconductor layer and a first sacrificial layer sequentially;
forming a spacer pattern at a certain constant pitch on the first sacrificial layer;
forming a mask layer that covers the spacer pattern;
forming a supporting pattern on the mask layer, wherein the supporting pattern is overlapped with at least a portion of the spacer pattern;
transferring the supporting pattern and the spacer pattern onto the first sacrificial layer to form a sacrificial gate pattern and a sacrificial supporting pattern; and
transferring the sacrificial gate pattern and the sacrificial supporting pattern onto the semiconductor layer to form a plurality of gates and a supporting gate,
wherein the plurality of gates and the supporting gate are extended by a first length in a first direction, a pitch between adjacent gates of the plurality of gates being equal to the certain constant pitch of the spacer pattern, and to a pitch between the supporting gate and an outermost gate of the plurality of gates, and wherein the first direction is parallel to an upper surface of the substrate.

* * * * *